(12) United States Patent
Zhang et al.

(10) Patent No.: US 10,833,081 B2
(45) Date of Patent: Nov. 10, 2020

(54) FORMING ISOLATED CONTACTS IN A STACKED VERTICAL TRANSPORT FIELD EFFECT TRANSISTOR (VTFET)

(71) Applicant: International Business Machines Corporation, Armonk, NY (US)

(72) Inventors: Chen Zhang, Albany, NY (US); Heng Wu, Guilderland, NY (US); Joshua M. Rubin, Albany, NY (US); Tenko Yamashita, Schenectady, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/378,852

(22) Filed: Apr. 9, 2019

(65) Prior Publication Data

US 2020/0328209 A1   Oct. 15, 2020

(51) Int. Cl.

| H01L 27/092 | (2006.01) |
|---|---|
| H01L 21/8238 | (2006.01) |
| H01L 29/66 | (2006.01) |
| H01L 29/78 | (2006.01) |
| H01L 21/768 | (2006.01) |
| H01L 29/417 | (2006.01) |
| H01L 29/06 | (2006.01) |

(52) U.S. Cl.
CPC ...... *H01L 27/092* (2013.01); *H01L 21/76831* (2013.01); *H01L 21/76877* (2013.01); *H01L 21/823871* (2013.01); *H01L 21/823878* (2013.01); *H01L 21/823885* (2013.01); *H01L 27/0922* (2013.01); *H01L 29/0642* (2013.01); *H01L 29/41741* (2013.01); *H01L 29/66666* (2013.01); *H01L 29/7827* (2013.01)

(58) Field of Classification Search
CPC ..... H01L 21/823885; H01L 21/823487; H01L 21/82285; H01L 21/823871; H01L 29/78642; H01L 29/78648; H01L 29/7889; H01L 29/7926; H01L 29/7802; H01L 29/7809; H01L 21/76831; H01L 21/76877; H01L 27/0922; H01L 29/7827
See application file for complete search history.

(56) References Cited

U.S. PATENT DOCUMENTS 4,810,906 A  *  3/1989  Shah .................. H01L 27/092
                                                     257/334
5,010,386 A  *  4/1991  Groover, III .......... H01L 27/092
                                                     257/328

(Continued)

*Primary Examiner* — Jose R Diaz
(74) *Attorney, Agent, or Firm* — Amin, Turocy & Watson, LLP

(57) ABSTRACT

Structures and methods that facilitate forming isolated contacts in stacked vertical transport field effect transistors (VTFETs). A pair of stacked VTFETs are formed on a substrate and isolated from each other. A via or hole is formed to extend to a drain of the second VTFET and a source of the first VTFET. The via is filled with a metal below the first VTFET to form the second contact. The second contact is capped with a non-conductive material and the remaining portion of the via is filled with metal to form the first contact. Alternatively, a via or hole is formed to extend to a source of the second VTFET and a source of the first VTFET. The second contact may serve as a local interconnect, a ground, or a voltage source connection.

20 Claims, 23 Drawing Sheets

(56) References Cited

U.S. PATENT DOCUMENTS

| | | |
|---|---|---|
| 7,329,916 B2 | 2/2008 | Schlosser et al. |
| 7,683,428 B2 | 3/2010 | Chidambarrao et al. |
| 9,177,890 B2 | 11/2015 | Du |
| 9,627,494 B2 * | 4/2017 | Masuoka ............ H01L 21/8221 |
| 9,659,963 B2 | 5/2017 | Cheng et al. |
| 9,853,038 B1 | 12/2017 | Cui |
| 10,074,652 B1 | 9/2018 | Cheng et al. |
| 2016/0043074 A1 | 2/2016 | Hurley et al. |
| 2018/0069131 A1 | 3/2018 | Balakrishnan et al. |

* cited by examiner

FORMING ISOLATED CONTACTS IN A STACKED VERTICAL TRANSPORT FIELD EFFECT TRANSISTOR (VTFET)

BACKGROUND

The subject disclosure relates to vertical transport field effect transistor (VTFET), and more specifically, to forming isolated contacts in a stacked VTFET.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments herein, devices and/or methods that form isolated contacts in a stacked vertical transport field effect transistor (VTFET) are described.

According to one embodiment, a semiconductor structure is provided. The semiconductor structure can comprise a first vertical transport field effect transistor (VTFET) comprising a first contact. The semiconductor structure can comprise a second VTFET transistor vertically stacked with the first VTFET and comprising a second contact that at least partially vertically overlaps the first contact and is electrically isolated from the first contact.

According to another embodiment, a method is provided. The method can comprise providing a substrate. The method can further comprise forming a first VTFET vertically stacked with a second VTFET on the substrate. The method can comprise forming a first contact to the first VTFET. The method can comprise forming a second contact to the second VTFET that at least partially vertically overlaps the first contact and is electrically isolated from the first contact.

According to another embodiment, a semiconductor chip is provided. The semiconductor chip can comprise a substrate and a first VTFET formed on the substrate and comprising a first contact. The semiconductor chip can also comprise a second VTFET transistor vertically stacked with the first VTFET and comprising a second contact that at least partially vertical overlaps the first contact and is electrically isolated from the first contact.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Notwithstanding the relative differences in dimensions between the examples shown in the figures used to describe the above concepts, it should be noted that FIGS. 1-21, referenced by this description, are not intended to be drawn to scale, and should not be relied upon in this respect.

The embodiments described herein relates to structures and methods of forming a semiconductor device in a semiconductor chip or die from a semiconductor substrate or wafer, and more specifically, forming isolated contacts for stacked FETs. Stacking FETs in the vertical direction can provide an additional dimension for CMOS area scaling. Vertical transport field effect transistors (VTFETs) have a structure that can help the stacking process. As opposed to planar CMOS devices, VTFETs are oriented with a vertical fin channel disposed between a top and bottom source/drain. The gate (e.g., gate stack) runs vertically alongside the vertical fin channel.

However, stacking planar FETs can be challenging because multiple vertical layers of interconnects are used. In one or more embodiments, vertically stacked contacts can be formed and isolated from each other to provide these interconnects.

An exemplary embodiment for forming isolated contacts for a stacked VTFET device is now described. The stacked VTFET design can include a n-channel FET (e.g. NFET) and a p-channel FET (e.g. PFET) stacked in either order. Configurations are contemplated herein in which either the NFET or the PFET is present at the bottom and top of the stack. Thus, both NFET stacked on PFET and PFET stacked on NFET designs are described herein. As such, in the description that follows, reference will be made to a top VFET (e.g., first VTFET) in the stack and a bottom VFET (e.g., second VTFET) in the stack. The bottom VFET can be either an NFET or a PFET. Likewise, the top WET can be either an NFET or a PFET.

Figure 1:
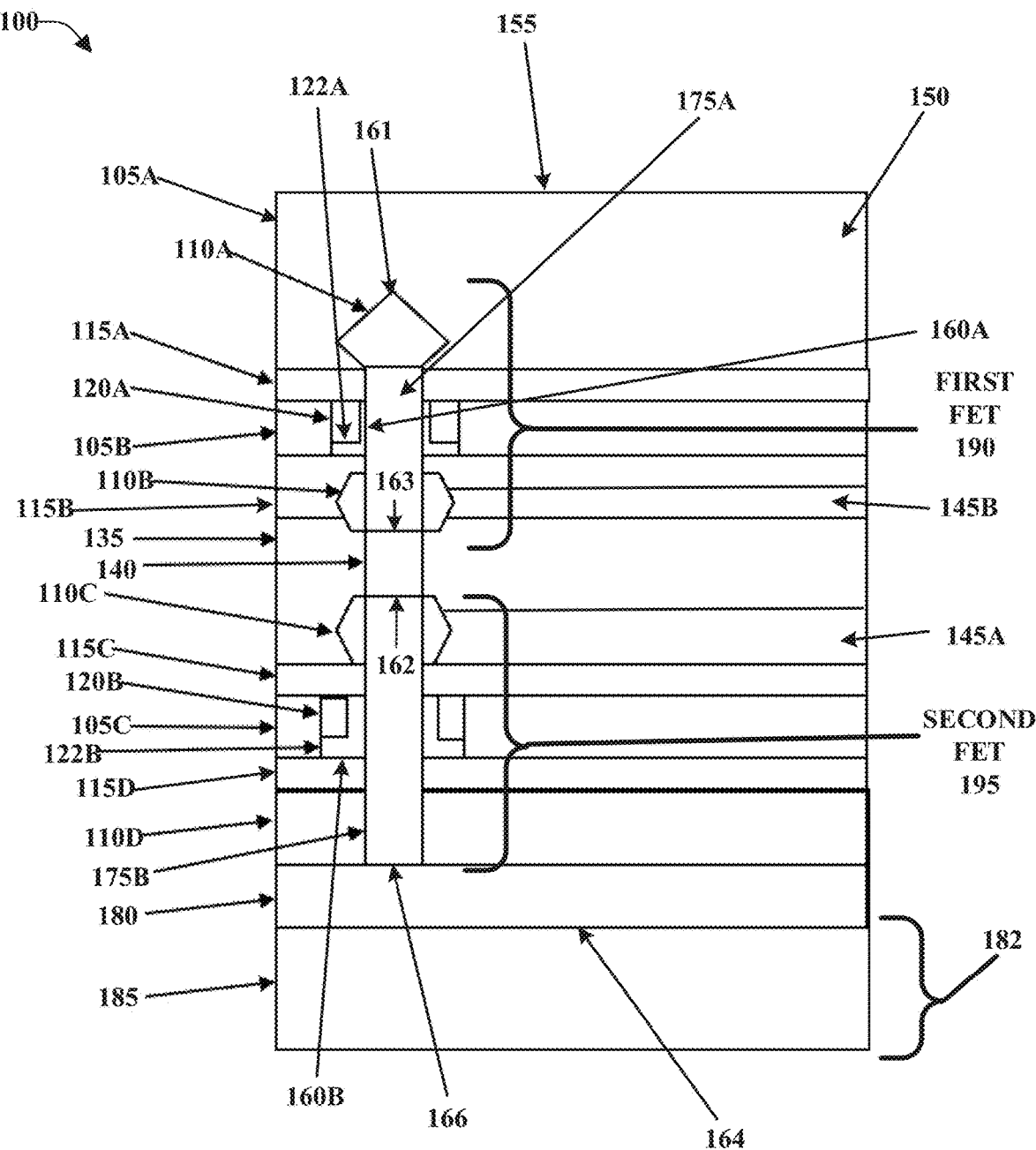
FIG. 1 illustrates an example, non-limiting, fin width cross-sectional view of a semiconductor structure including a first field effect transistor (FET) and a second FET, in accordance with one or more embodiments described herein.

For a first series of one or more embodiments, FIG. 1 illustrates an example, non-limiting fin length cross-sectional view 100 of semiconductor structure 150 including a first FET 190 and a second FET 195, in accordance with one or more embodiments described herein. FIG. 1 depicts a cross-sectional view of semiconductor structure 150, oriented with a first surface 155 of semiconductor structure 150 being at the top of the figure as shown, and with substrate layer 185 on an opposite side at the bottom of the figure as shown.

In one or more embodiments, the first surface 155 and second surface 164 of semiconductor structure 150 can correspond to the front side and backside (or back side) of semiconductor structure 150. A backside conductive plane can be affixed to second surface 164 and serve as a conductive plane of the semiconductor structure 150. An area corresponding to an example backside area 182 of semiconductor structure 150 is labeled in FIG. 1 to provide an example relative location of the backside relative to other structures of semiconductor structure. As depicted in FIG. 1, backside area 182 corresponds to substrate layer 185, but as described herein other types of layers can be in backside area 182.

In one or more embodiments, semiconductor structure 150 can be formed a layer at a time starting at a substrate base layer and adding layers sequentially upwards. For example, semiconductor structure 150 can be fabricated from a semiconductor wafer that serves as substrate 185. Material used for substrate layer 185 can vary. In one or more embodiments, substrate layer 185 can comprise a silicon wafer. According to another aspect, substrate layer 185 can comprise silicon dioxide affixed to a side of a silicon wafer. In another aspect, substrate layer 185 can comprise a compound semiconductor such as Indium gallium arsenide (InGaAs) or indium phosphide (InP).

Substrate layer 185 can form the initial layer of semiconductor structure 150. The side opposite to the backside of the semiconductor structure 150 (e.g., the front side of the semiconductor structure 150) can also be termed the fabrication side, because this is where the fabrication of layers and components can be performed, as illustrated in FIGS. 3-12. A semiconductor device may comprise any number of semiconductor structures 150.

With respect to representations of the orientation and relationship of components of semiconductor structure 150 shown in the drawings and described in the detailed description, it is noted that, while the drawings or configuration descriptions may depict components stacked in a particular orientation, one or more embodiments can have the components described herein in any orientation, including, but not limited to, an inverted structure and a structure rotated to an angle. All such embodiments are envisaged and intended to be encompassed by the disclosures herein, e.g., the terms back and front are non-limiting of the orientation of one or more embodiments. As described herein, one or more embodiments can provide isolated contacts for semiconductor structure 150 that are vertically overlapping and can accommodate the interconnects used for first FET 190 and second FET 195.

In one or more embodiments, semiconductor structure 150 is a layered stack structure that is formed starting from substrate layer 185. Semiconductor structure 150 can comprise a first VTFET and a second VTFET, e.g., first FET 190 and second FET 195.

The stacked VTFET design that can be used by one or more embodiments described herein, can include an NFET and a PFET stacked in either order. Namely, configurations are contemplated herein in which either the NFET or the PFET is present at the base and a side opposite the base of the stack. Thus, both NFET stacked on PFET and PFET stacked on NFET designs are described herein. Thus, as described herein second FET 195 can be either an NFET or a PFET, and first FET 190 can be either an NFET or a PFET. According to some implementations, first FET 190 can be fabricated stacked on first surface 162 of the second FET 195, e.g., first FET 190 formed on first surface 162 being the first surface of epitaxial layer 110C of second FET 195. One or more embodiments described herein can facilitate forming source/drain contacts that are isolated from each other and vertically stacked.

In one or more embodiments, semiconductor structure 150 can comprise a buried insulator layer to separate and electrically insulate second FET 195 from substrate layer 185. In one or more embodiments, as depicted in FIG. 1, an oxide can be deposited on substrate layer 185 to form a buried insulator layer termed a buried oxide (BOX) 180 layer. In one or more embodiments described herein, a conductive plane (e.g., substrate layer 185) can be on second surface 164 of semiconductor structure 150, e.g., a surface opposite to the first surface 162 of second FET 195. This conductive plane can serve as a power rail, voltage source, or electrical ground for semiconductor structure 150.

Formed on a surface of BOX layer 180 opposite to substrate layer 185, a second source/drain (not shown) for second FET 195 can be patterned to surround the base of vertical fin channel 175B. The second source/drain can be in the form of second epitaxial layer 110D. Second epitaxial layer 110D can be formed, in one or more embodiments, by epitaxial growth of highly doped semiconductors. A second surface 166 of second FET 195 corresponds to a side of second epitaxial layer 110D affixed to BOX layer 180.

The polarity of the dopant (n-type or p-type) for the second epitaxial layer 110D can vary depending on whether second FET 195 is an NFET or PFET. For example, if second FET 195 is an NFET, example n-type dopants that can be used to create epitaxial layer 110C and second epitaxial layer 110D can include, but are not limited to, phosphorous and/or arsenic, and if second FET 195 is a PFET, suitable p-type dopants can include, but are not limited to, boron. In another example, phosphosilicate glass (PSG) can be also used as an n-type dopant and borosilicate glass (BSG) can be used as a p-type dopant.

Second FET 195 can include vertical fin channel 175B. Vertical fin channel 175B can be present between the second epitaxial layer 110D of second FET 195 and the epitaxial layer 110C of second FET 195.

To separate second epitaxial layer 110D from gate stacks 160B, second spacer 115D can be formed on second epitaxial layer 110D. Formed on second spacer 115D, third ILD 105C can include gate stacks 160B of second FET 195. The dielectric material for third ILD 105C can be, but is not limited to, a nitride-based material that can be used for isolation purposes. For example, third ILD 105C can be a determined depth (e.g., height), which can be the amount of space or isolation between second spacer 115D and first spacer 115C.

Gate stacks 160B can include a gate dielectric 122B and gate conductor 120B of the second VTFET and can be formed alongside the vertical fin channel 175B and on second spacer 115D. In one or more embodiments, gate dielectric 122B can be composed of a high-κ dielectric. The term "high-κ" as used herein can refer to a material having a relative dielectric constant κ which can be much higher than that of silicon dioxide (e.g., a dielectric constant κ=25 for hafnium oxide rather than 4 for silicon dioxide). Suitable high-κ gate dielectrics can include, but are not limited to, hafnium oxide and lanthanum oxide.

In one or more embodiments, gate conductor 120B can be a metal gate, formed with gate conductor 120B being a metal or combination of metals. In one or more embodiments, the metal gate of gate conductor 120B can be composed of a workfunction metal (WFM). A particular WFM that can be employed depending on whether second FET 195 is an NFET (n-type WFM) or PFET (p-type WFM). When the second FET 195 is an NFET, the WFM employed can be an n-type WFM. Suitable n-type WFMs can include, but are not limited to, titanium nitride, tantalum nitride and/or aluminum-containing alloys such as titanium aluminide, titanium aluminum nitride, titanium aluminum carbide, tantalum aluminide, tantalum aluminum nitride, and/or tantalum aluminum carbide. When the second FET 195 is a PFET, the WFM employed can be any p-type WFM. Suitable p-type WFMs can include, but are not limited to, titanium nitride, tantalum nitride, and tungsten.

Semiconductor structure 150 can include first spacer 115C between epitaxial layer 110C of second FET 195 and third ILD 105C. First spacer 115C can be patterned on gate stacks 160B and third ILD 105C of second FET 195. First spacer 115C can be patterned around vertical fin channel 175B. Suitable materials for the first spacer 115C can include, but are not limited to, silicon dioxide and/or silicon oxycarbide.

Second FET 195 can include epitaxial layer 110C, with a first surface opposite to first spacer 115C being the first surface 162 of second FET 195. Epitaxial layer 110C can be formed by depositing dopant onto first spacer 115C alongside vertical fin channel 175B. Epitaxial layer 110C can serve as a dopant source for forming a first source/drain for second FET 195.

Semiconductor structure 150 can include isolation spacer 135 between second spacer 115B of first FET 190 and first spacer 115C of second FET 195. In one or more embodiments, isolation spacer 135 can surround second epitaxial layer 110B of first FET 190 and epitaxial layer 110C of second FET 195. Isolation spacer 135 can isolate second FET 195 from first FET 190 in accordance with one or more embodiments described herein. Isolation spacer 135 can be patterned above epitaxial layer 110C of second FET 195 around the vertical fin channel 175B. Suitable materials for isolation spacer 135 can include, but are not limited to, dielectric materials such as silicon nitride and/or silicon oxynitride. As shown, isolation spacer 135 can comprise a sacrificial layers 145A and 145B. Suitable materials for sacrificial layers 145A and 145B can include but are not limited to silicon and/or silicon dioxide.

Formed on isolation spacer 135, semiconductor structure 150 can further include first FET 190 vertically stacked (e.g., on second surface 163 of the first FET 190) on on second FET 195. First FET 190 can be formed over the second FET 195. First FET 190 can include vertical fin channel 175A. Vertical fin channel 175A can be present between the second epitaxial layer 110B and epitaxial layer 110A of first FET 190. Vertical fin channel 175B of second FET 195 can be separated from vertical fin channel 175A of the first VTFET by buried insulator layer 140.

Formation of the first FET 190 can proceed in the same general manner as with second FET 195, however, with a device of the opposite polarity being formed. For example, if second FET 195 is an NFET, then first FET 190 can be formed as a PFET, and if second FET 195 is a PFET, then first FET 190 can be formed as a NFET. In one or more embodiments, as discussed below, when second FET 195 is an NFET, substrate layer 185 can be a ground plane, and when second FET 195 is a PFET, substrate layer 185 can be a power plane that provides a voltage source to semiconductor structure 150.

First FET 190 can include second spacer 115B surrounding second epitaxial layer 110B of first FET 190. Second spacer 115B and second epitaxial layer 110B can form second surface 163 of first FET 190. Second spacer 115B can be patterned around vertical fin channel 175A. Suitable materials for second spacer 115B can include, but are not limited to, silicon dioxide and/or silicon oxycarbide.

Formed on second spacer 115B, first FET 190 can include second ILD 105B with gate stacks 160A of first FET 190. In a similar manner as third ILD 105C described above, the dielectric material for second ILD 105B can be a nitride-based material that can be used for isolation purposes. In one or more embodiments, second ILD 105B can be a determined depth (e.g., height), which can be the amount of space or isolation between second spacer 115B and the first spacer 115A.

In a similar manner as gate stacks 160B of third ILD 105C described above, gate stacks 160A can have parts including work function metal (WFM) 120A and high-k dielectric 122A.

First FET 190 can further include first spacer 115A between epitaxial layer 110A and second ILD 105B. In a similar manner as first spacer 115C of second FET 195, first spacer 115A can be patterned on second ILD 105B. Particularly, in one or more embodiments, first spacer 115A can be patterned on gate stacks 160A of second ILD 105B.

First FET 190 can include epitaxial layer 110A. In a similar manner to epitaxial layer 110C of second FET 195, epitaxial layer 110A can be formed by depositing dopant onto first spacer 115A alongside vertical fin channel 175A. Epitaxial layer 110A can serve as a dopant source for forming a first source/drain for first FET 190.

First FET 190 can include first interlayer dialectic (ILD) 105A of first FET 190. First ILD 105A of first FET 190 can be patterned on first spacer 115A around epitaxial layer 110A of first FET 190. First ILD 105A material can be deposited on first spacer 115A then and recessed to a determined depth. In one or more embodiments, stand lithography and etching techniques can be used to pattern first ILD 105A on the first spacer 115A. A directional etching process, such as reactive ion etching, can be used to pattern first ILD 105A. In one or more embodiments, a side of first ILD 105A can be the first surface 155 of semiconductor structure 150 and a side of epitaxial layer 110A opposite to second surface 163 of first FET 190 can be first surface 161 of first FET 190.

It should be noted that the embodiments discussed below can begin after the formation of semiconductor structure 150 described above. As would be appreciated by one having skill in the relevant art, given the disclosure herein, variations in materials, techniques of semiconductor fabrication, semiconductor structures, and semiconductor layers can be implemented without departing from the spirit of embodiments described herein.

Figure 2:
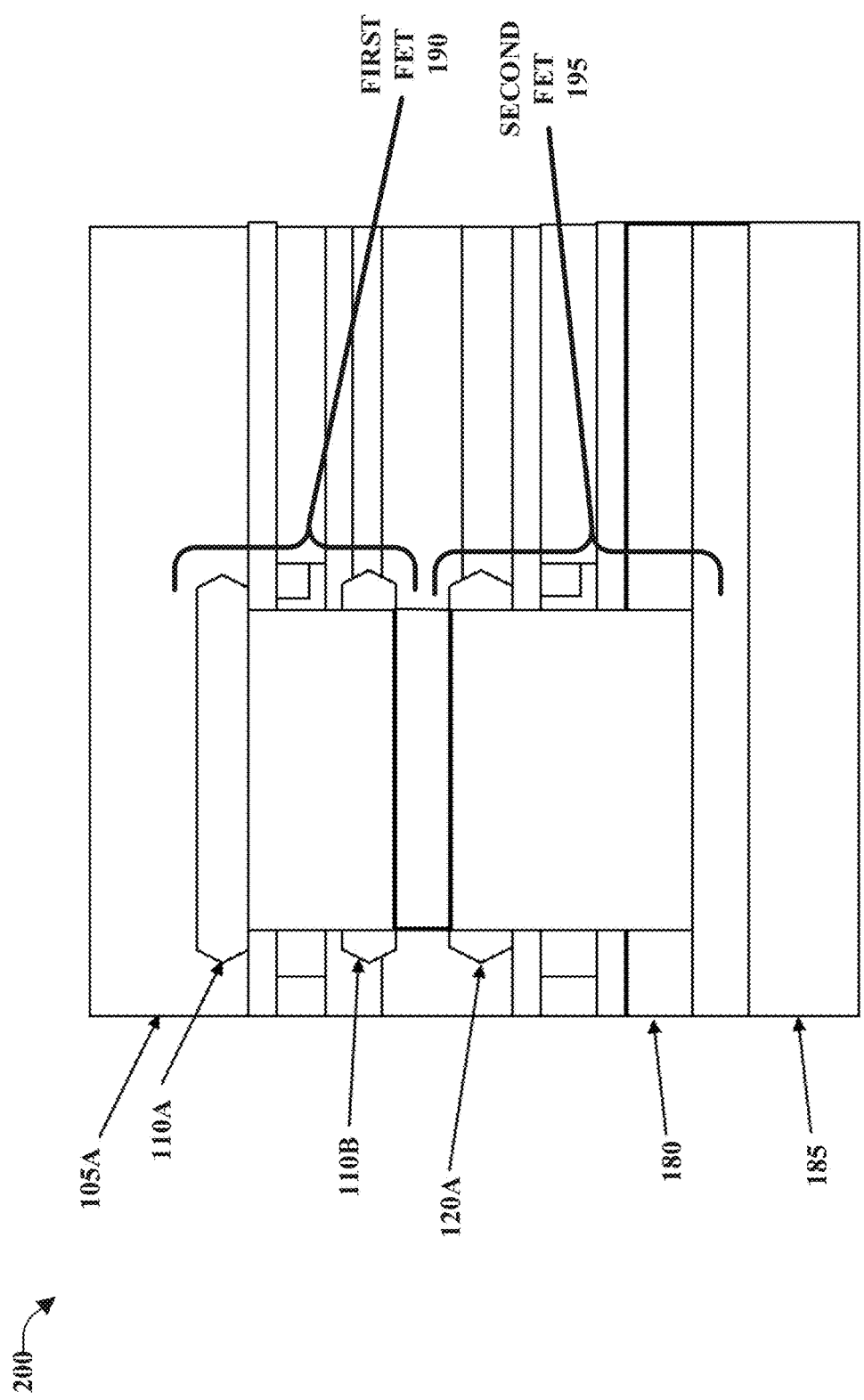
FIG. 2 illustrates an example, non-limiting fin length cross-sectional view of the example semiconductor structure described in FIG. 1, in accordance with one or more embodiments described herein.

FIG. 2 illustrates an example, non-limiting fin length cross-sectional view 200 of the example semiconductor structure 150 described in FIG. 1, in accordance with one or more embodiments described herein. Repetitive description of like elements employed in other embodiments described herein is omitted for sake of brevity.

With reference to the differences between FIGS. 1 and 2, it should be noted that FIGS. 1 and 2 are respectively fin width and fin length cross sectional diagrams of semiconductor structure 150. While FIG. 1 depicts the width side of semiconductor structure 150 and FIG. 2 depicts the length side, it should be appreciated that the embodiments described herein can be implemented with a via placed adjacent to the length end, as shown in FIG. 4 or with a via placed adjacent to the width end, as shown in FIG. 3 discussed below.

As noted above, with the stacked structure of VTFETs, some components can be obstructed by other components and thus have less options available for electrically coupling to a conductive plane. As detailed with FIGS. 3-12 below, one or more embodiments are described to provide the formation of isolated source/drain contacts for first FET 190 and second FET 195. The isolated source/drain contacts can be vertically stacked, and thus, accommodate the vertical stacked transistor configuration of semiconductor structure 150.

Figure 3:
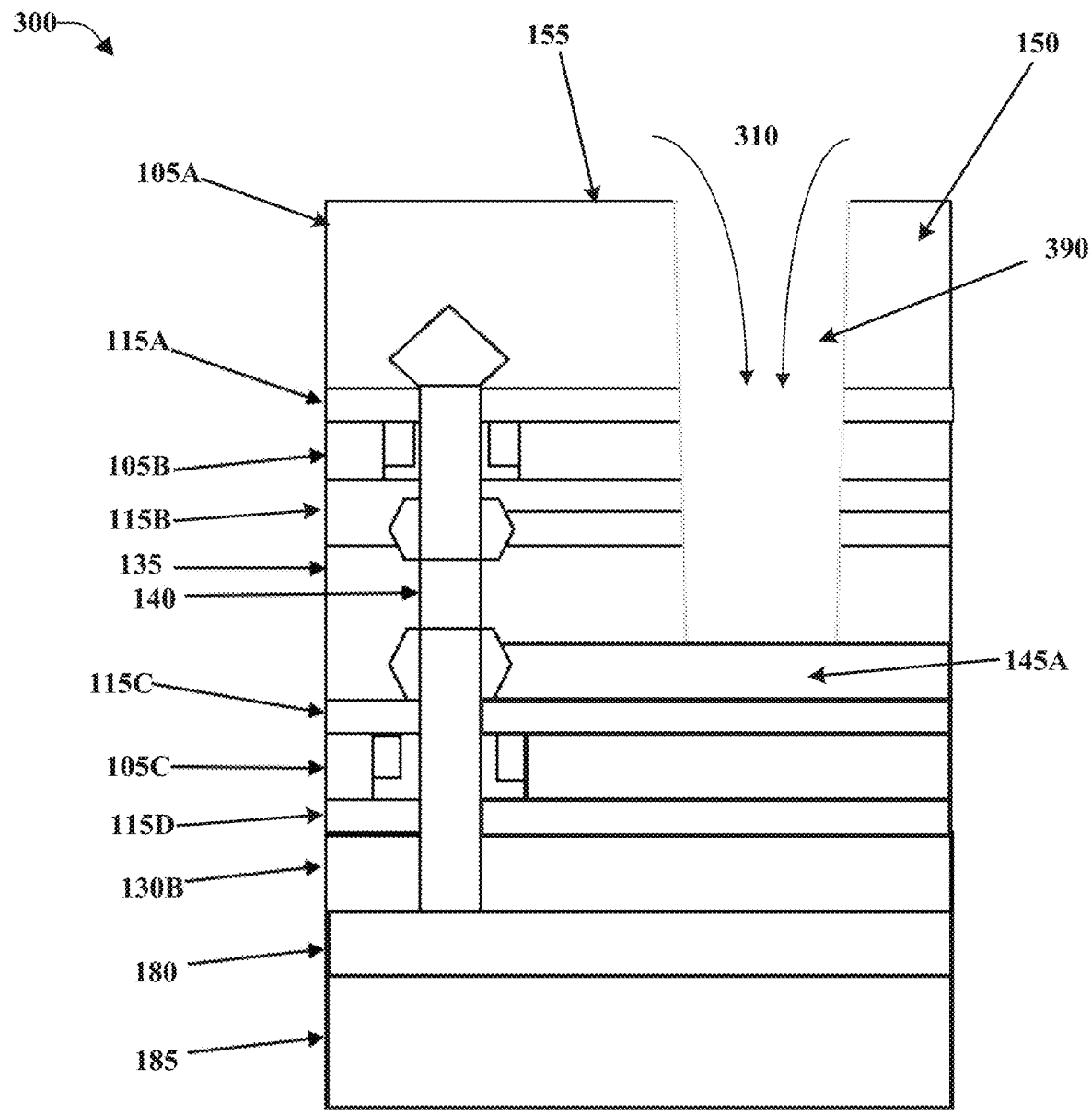
FIG. 3 illustrates an example, non-limiting, fin width cross-sectional view of the example semiconductor structure of FIG. 1 during a fabrication stage that can create a via for a contact trench from a first surface of the semiconductor structure, in accordance with one or more embodiments described herein.
Figure 4:
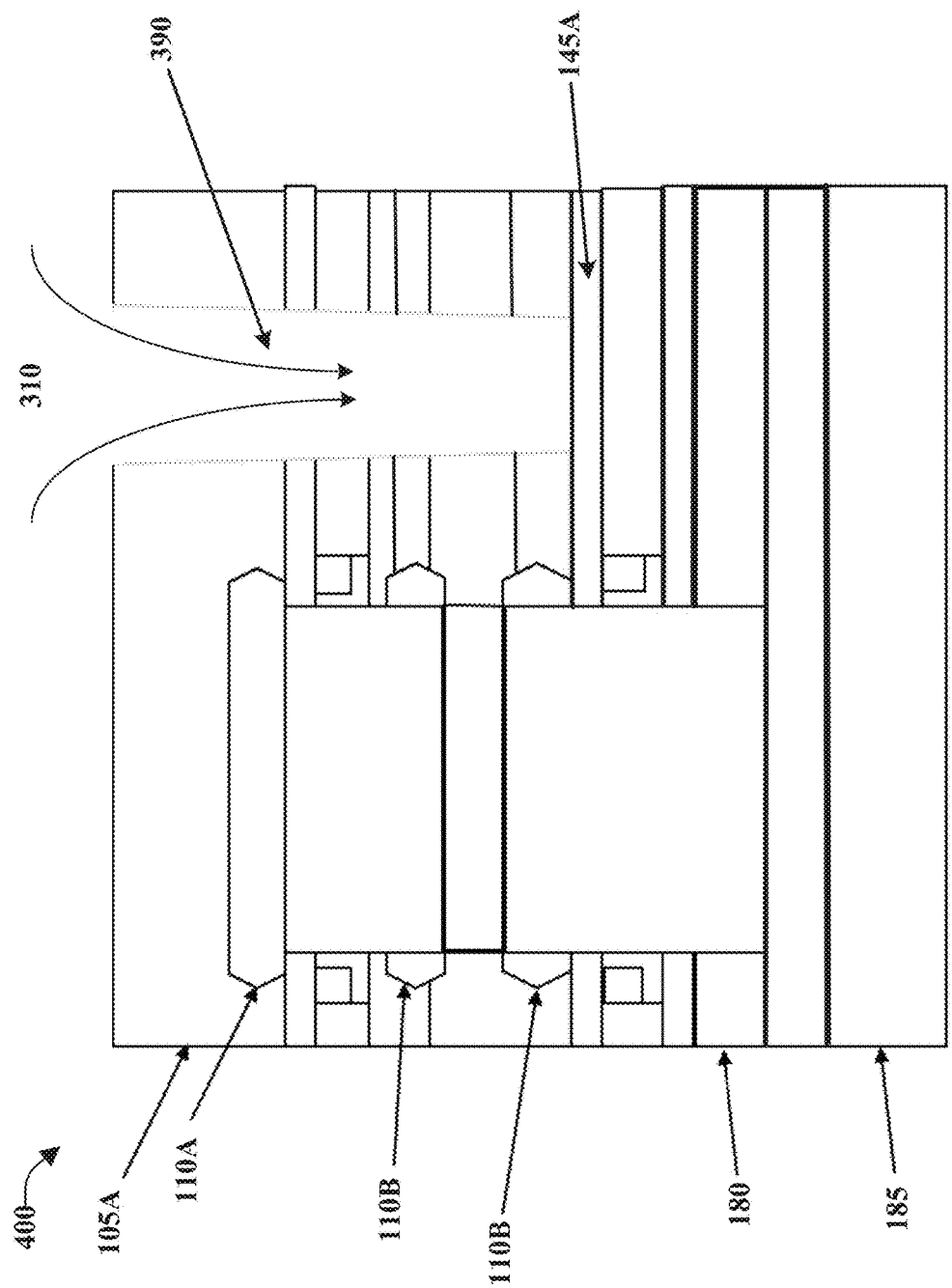
FIG. 4 illustrates an example, non-limiting fin length cross-sectional view of the example semiconductor structure of FIG. 2 during a fabrication stage similar to the stage described in FIG. 3, in accordance with one or more embodiments described herein.

FIG. 3 illustrates an example, non-limiting, fin width cross-sectional view 300 of semiconductor structure 150 of FIG. 1 during a fabrication stage that can create a via 390 from the first surface 155 of semiconductor structure 150 to sacrificial layer 145A of semiconductor structure 150, in accordance with one or more embodiments described herein.

Via 390 provides a free space in which various materials can be filled and/or deposited to form source/drain contacts for semiconductor structure 150. In one or more embodiments, via 390 is filled, recessed, and filled again with various materials (as will be further described with reference to FIGS. 4-12) to form source/drain contacts for first FET 190 and second FET 195 that are vertically overlapped and isolated from each other. In one or more embodiments, this feature can allow semiconductor structure 150 to have an efficient layout both vertically and horizontally.

As depicted, in the example of FIG. 3, via 390 can be an inter-layer recess that starts at the first surface 155 of semiconductor structure 150 and traverse down through several layers to a determined depth at sacrificial layer 145A. It should be noted that different combinations of the same, additional, or fewer layers can also be traversed by via 390 without departing from the spirit of embodiments described herein.

In one or more embodiments, via 390 can be formed by patterning to remove a portion of semiconductor structure 150 to create a recess. Standard lithography and etching techniques 310 can be used to pattern via 390. In one or more embodiments, a directional etching process 310, such as reactive ion etching, can be used for etching via 390. In an alternative to the placement of via 390 as depicted in FIG. 3, etching techniques, such as reactive ion etching noted above, can be used create via 390 with a deeper ending point. For example, instead of ending at sacrificial layer 145A, via 390 can end partway through sacrificial layer 145A to a determined depth (not shown). In an alternative to the cutting down through layers approach to creating via 390, in one or more alternative embodiments, via 390 can be formed by using different approaches, e.g., using techniques to form the via spaces within layers as they are created.

At the end of the fabrication state depicted in FIG. 3, semiconductor structure can include first FET 190 stacked on second FET 195, and via 390 spanning from first surface 155 of semiconductor structure 150 to sacrificial layer 145A.

FIG. 4 illustrates an example, non-limiting fin length cross-sectional view 400 of the example semiconductor structure 150 of FIG. 2, during a fabrication stage similar to the stage described in FIG. 3, in accordance with one or more embodiments described herein. Repetitive description of like elements employed in other embodiments described herein is omitted for sake of brevity. As shown, via 390 is formed and spans from first surface 155 of semiconductor structure 150 to sacrificial layer 145A.

The fin width and fin length views of via 390 (e.g., FIGS. 3 and 4) are included to show example placements of a via in relation to the stacked VTFETs (e.g., first FET 190 and second FET 195) of semiconductor structure 150. For example, the different relative placements of via 390 of FIGS. 3 and 4, do not have any substantial effects on the operation of the embodiments described herein.

Figure 5:
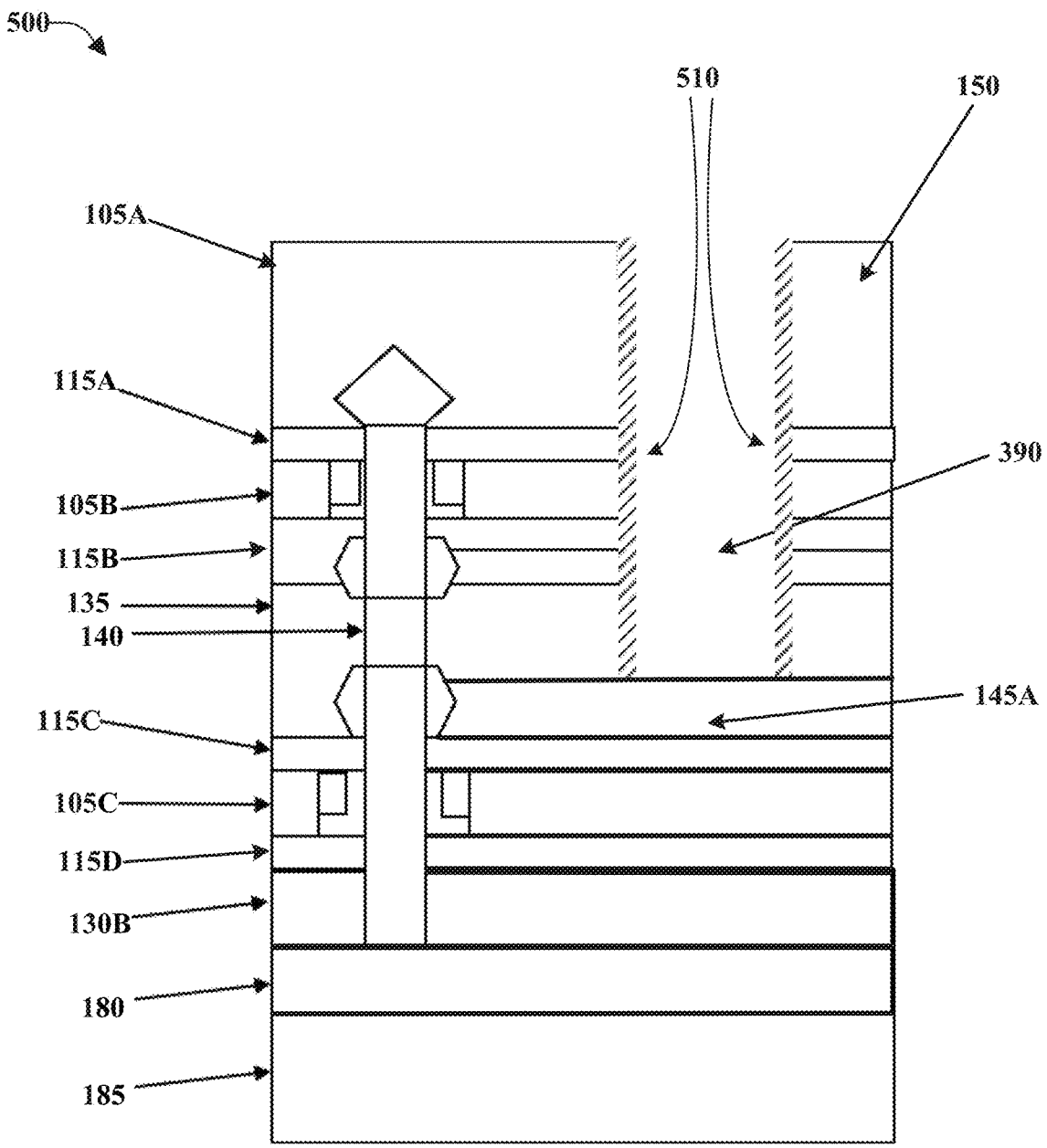
FIG. 5 illustrates an example, non-limiting, fin width cross-sectional view of the example semiconductor structure of FIG. 3 during a fabrication stage that can deposit a liner in a via, in accordance with one or more embodiments described herein. Repetitive description of like elements employed in other embodiments described herein is omitted for sake of brevity.

FIG. 5 illustrates an example, non-limiting fin width cross-sectional view 500 of the example semiconductor structure 150 of FIG. 3 during a fabrication stage that can deposit liner material 510 into via 390, in accordance with one or more embodiments described herein. Repetitive description of like elements employed in other embodiments described herein is omitted for sake of brevity.

Liner 510 can comprise any suitable materials, such as titanium nitride, or other known liner material(s). As shown, liner 510 can line the sidewall (and/or bottom) surfaces of via 390. Deposition of liner 510 can be performed using, for example atomic layer deposition (ALD). In one or more embodiments, other deposition processes, such as, chemical vapor deposition (CVD) or physical vapor deposition (PVD) can be used. Liner 510 can be any suitable dimension. For example, liner 510 can be, but is not limited to, about 5 angstroms to about 20 nm in thickness.

Figure 6:
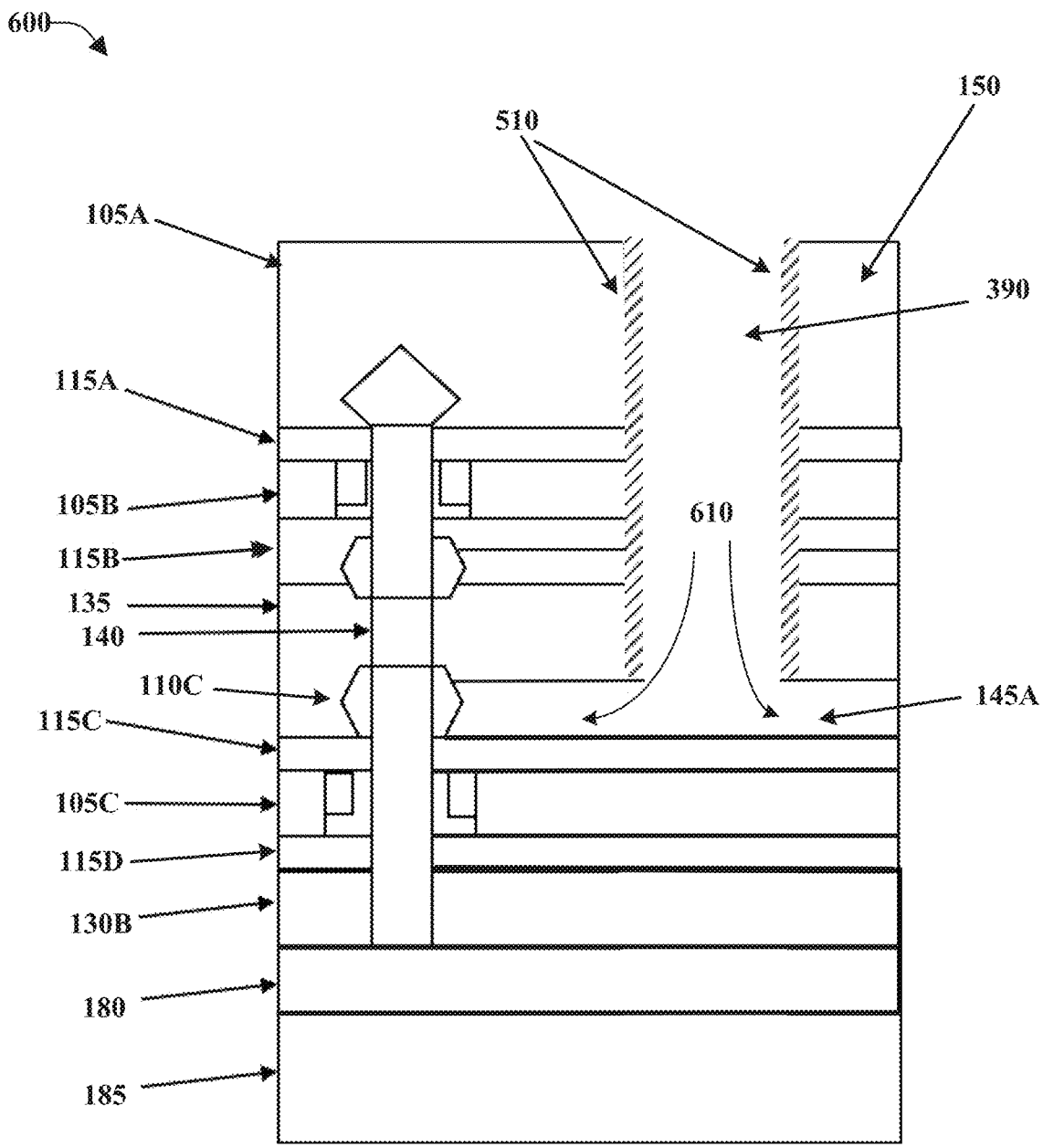
FIG. 6 illustrates an example, non-limiting, fin width cross-sectional view of the semiconductor structure of FIG. 5 during a fabrication stage where the sacrificial oxide for the first VTFET is removed, in accordance with one or more embodiments described herein.

FIG. 6 illustrates an example, non-limiting fin width cross-sectional view of the semiconductor structure of FIG. 5 during a fabrication stage 610 where sacrificial layer 145A is removed to establish access to epitaxial layer 110C of second FET 195. As depicted in FIG. 6, the removal of the sacrificial layer 145A can define a space or path from via 390 to epitaxial layer 110C. Repetitive description of like elements employed in other embodiments described herein is omitted for sake of brevity.

In one or more embodiments, Sacrificial layer 145A thus provides a temporary space defining a connective path extending between the epitaxial layer 110C and via 390 in which conductive material, such as a metal, can be filled. In one or more embodiments, sacrificial layer 145A is eroded or otherwise removed to expose epitaxial layer 110C of second FET 195. Sacrificial layer 145A can be eroded using a wet-etch process or a dry-etch process that selectively etches the sacrificial layer 145A while leaving remaining structures largely intact.

Figure 7:
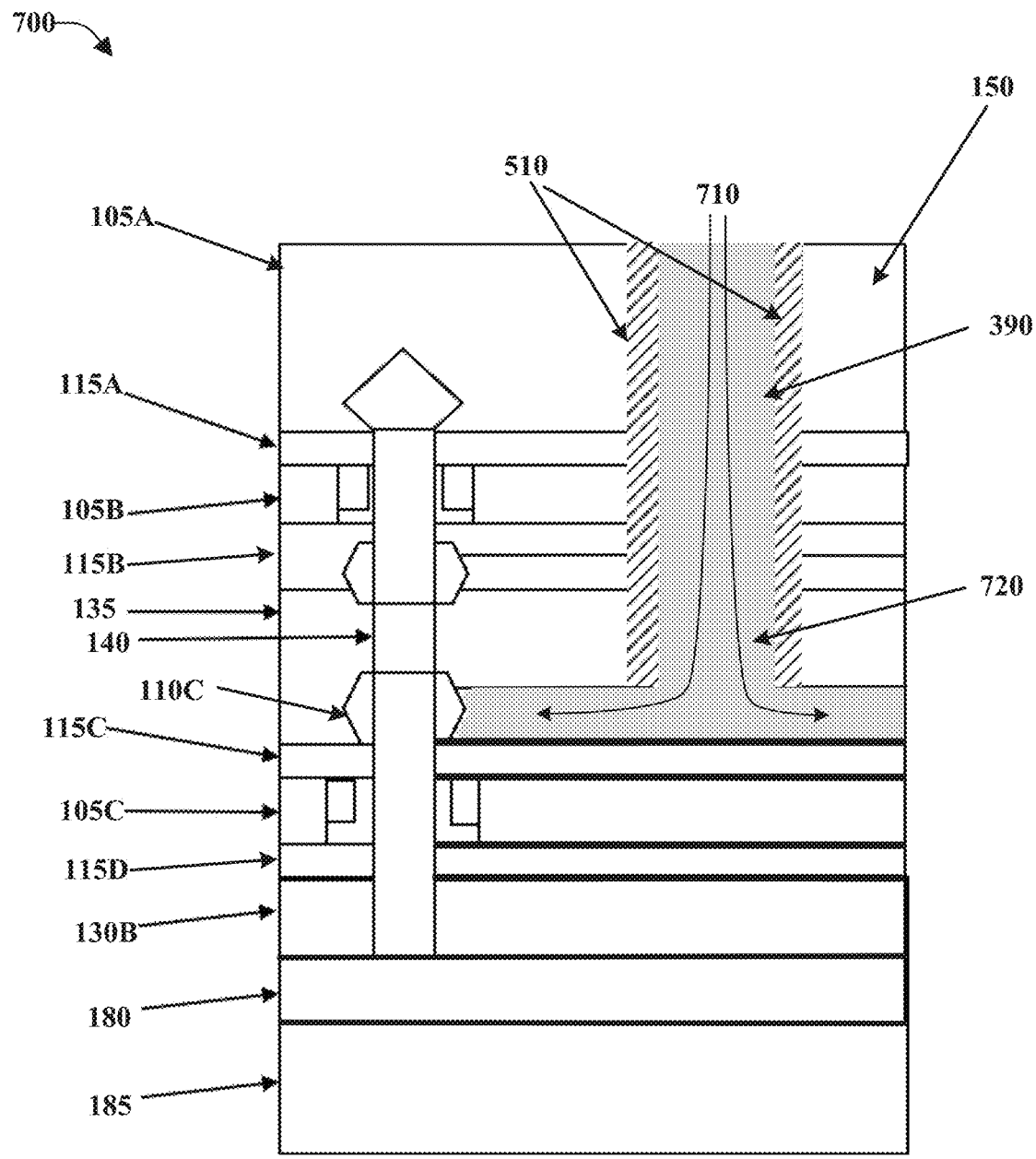
FIG. 7 illustrates an example, non-limiting, fin width cross-sectional view of the semiconductor structure of FIG. 6 during a fabrication stage where the conductive material can be deposited until an electrical connection with the first VTFET is established, in accordance with one or more embodiments described herein.

FIG. 7 illustrates an example, non-limiting fin width cross-sectional view 700 of semiconductor structure 150 of FIG. 6 during a fabrication stage 710 where conductive material 720 is deposited into via 390 and the free space of sacrificial layer 145A, in accordance with one or more embodiments described herein. During the filling of via 390 with conductive material 720, the space left by the removal of the sacrificial material in sacrificial layer 145A is filled with conductive material, channeled from via 390, and provides a contact extending to epitaxial layer 110C. Repetitive description of like elements employed in other embodiments described herein is omitted for sake of brevity.

Conductive material 720 can be any metal or suitable material, including, but not limited to, indium-tin oxide, indium-zinc oxide, aluminum-zinc oxide, titanium, aluminum molybdenum, copper, cobalt, silver, gold, nickel, tungsten, chromium, hafnium, platinum, iron and their alloys.

Figure 8:
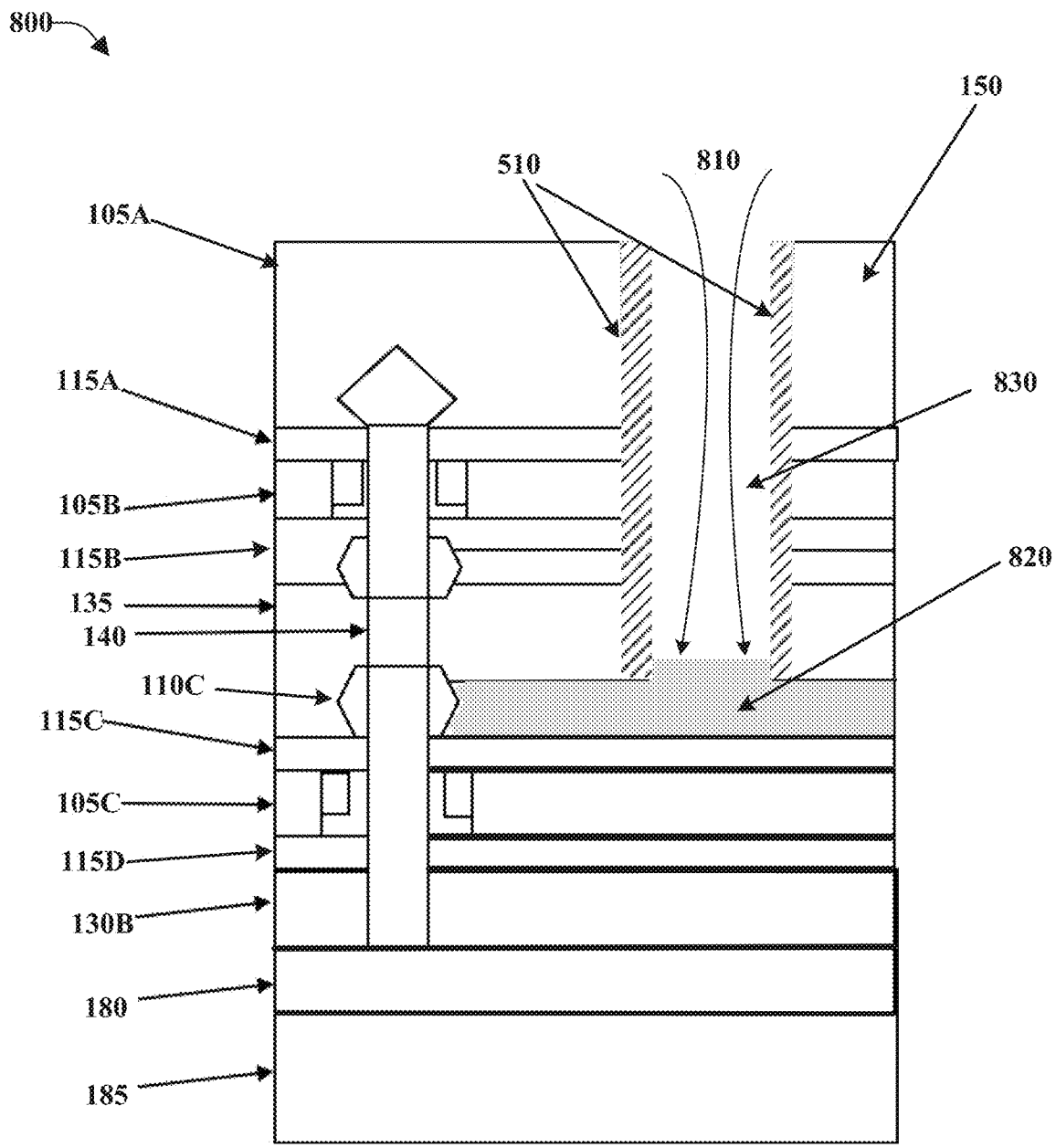
FIG. 8 illustrates an example, non-limiting, fin width cross-sectional view of the semiconductor structure of FIG. 7 during a fabrication stage where the conductive material can be recessed down, in accordance with one or more embodiments described herein.

FIG. 8 illustrates an example, non-limiting fin width cross-sectional view of the semiconductor structure of FIG. 7 during a fabrication stage 810 where the conductive material 720 can be recessed down to remaining conductive material 820, in accordance with one or more embodiments described herein. As shown, conductive material 720 has been recessed down to a portion depicted as conductive material 820 to a determined depth below first FET 190. Accordingly, via 830 is now formed above conductive material 820. In one or more embodiments, known lithography and etching techniques can be used to recess conductive material 720 and form conductive material 820.

Figure 9:
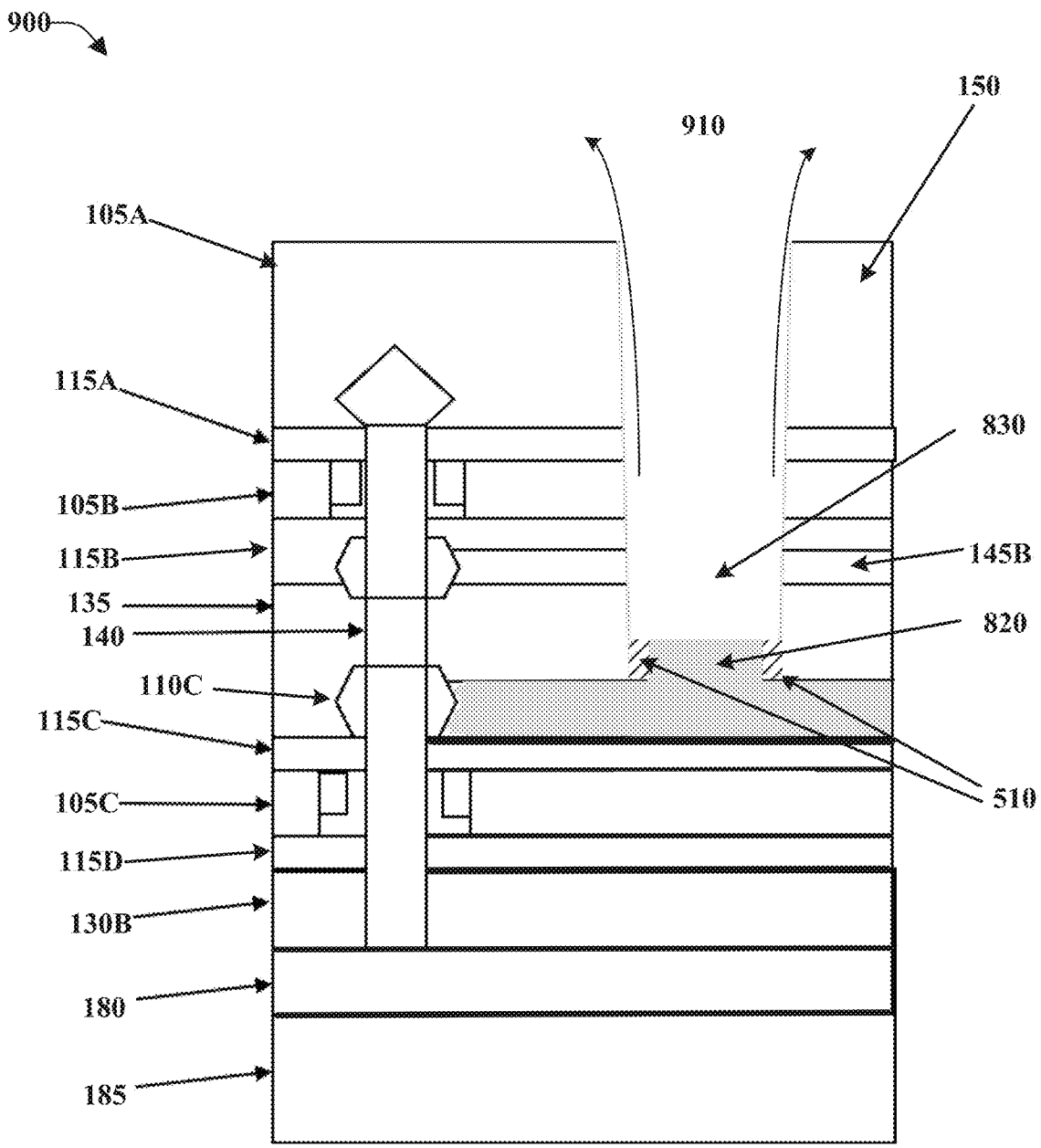
FIG. 9 illustrates an example, non-limiting, fin width cross-sectional view of the semiconductor structure of FIG. 8, during a fabrication stage where the liner in the via is removed, in accordance with one or more embodiments described herein.

FIG. 9 illustrates an example, non-limiting fin width cross-sectional view of the semiconductor structure of FIG. 8, during a fabrication stage where portions of the liner 510 above conductive material 820 are removed, in accordance with one or more embodiments described herein. In one or more embodiments, known lithography and etching techniques can be used to selectively remove portions of liner 510 above conductive material 820. In addition, removal of this upper portion of liner 510 now exposes sacrificial layer 145B to via 830.

Figure 10:
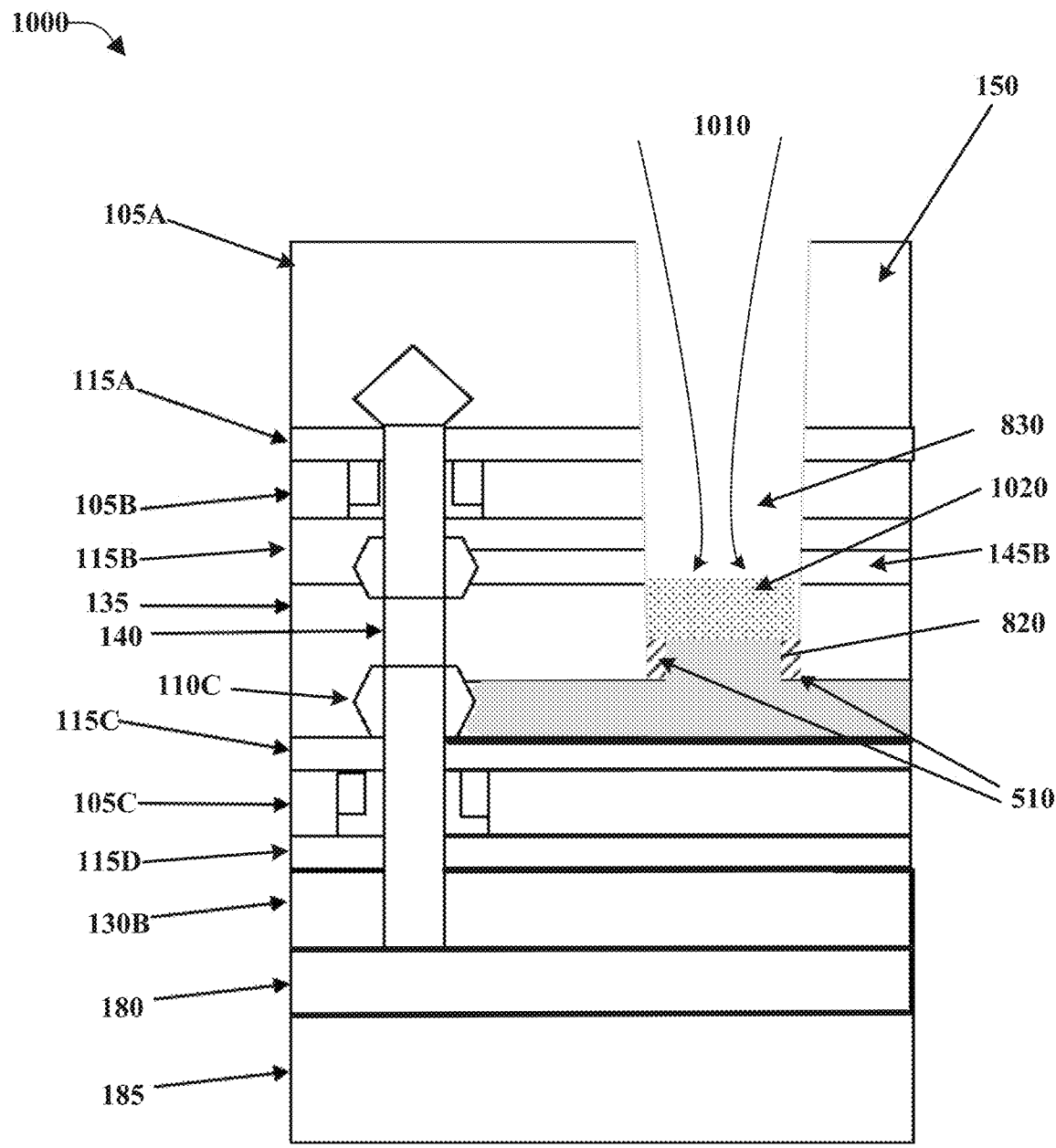
FIG. 10 illustrates an example, non-limiting fin length cross-sectional view of a semiconductor structure similar to the semiconductor structure of FIG. 9, during a fabrication stage where a capping material is deposited.

FIG. 10 illustrates an example, non-limiting fin length cross-sectional view of a semiconductor structure similar to the semiconductor structure of FIG. 9, during a fabrication stage 1010 where a cap 1020 is deposited. As shown, cap 1020 can be any non-conductive capping material, such as a dielectric or other isolating material, and can be deposited on top of conductive material 820. Cap 1020 can serve as an insulator from conductive material 820, and thus, can enable another layer of interconnects in the vertical direction. Cap 1020 can be deposited until it reaches a determined height. In one or more embodiments, cap 1020 is deposited until it reaches a height approximately to the bottom of sacrificial layer 145B. Any height for cap 1020 can be used in the embodiments.

Figure 11:
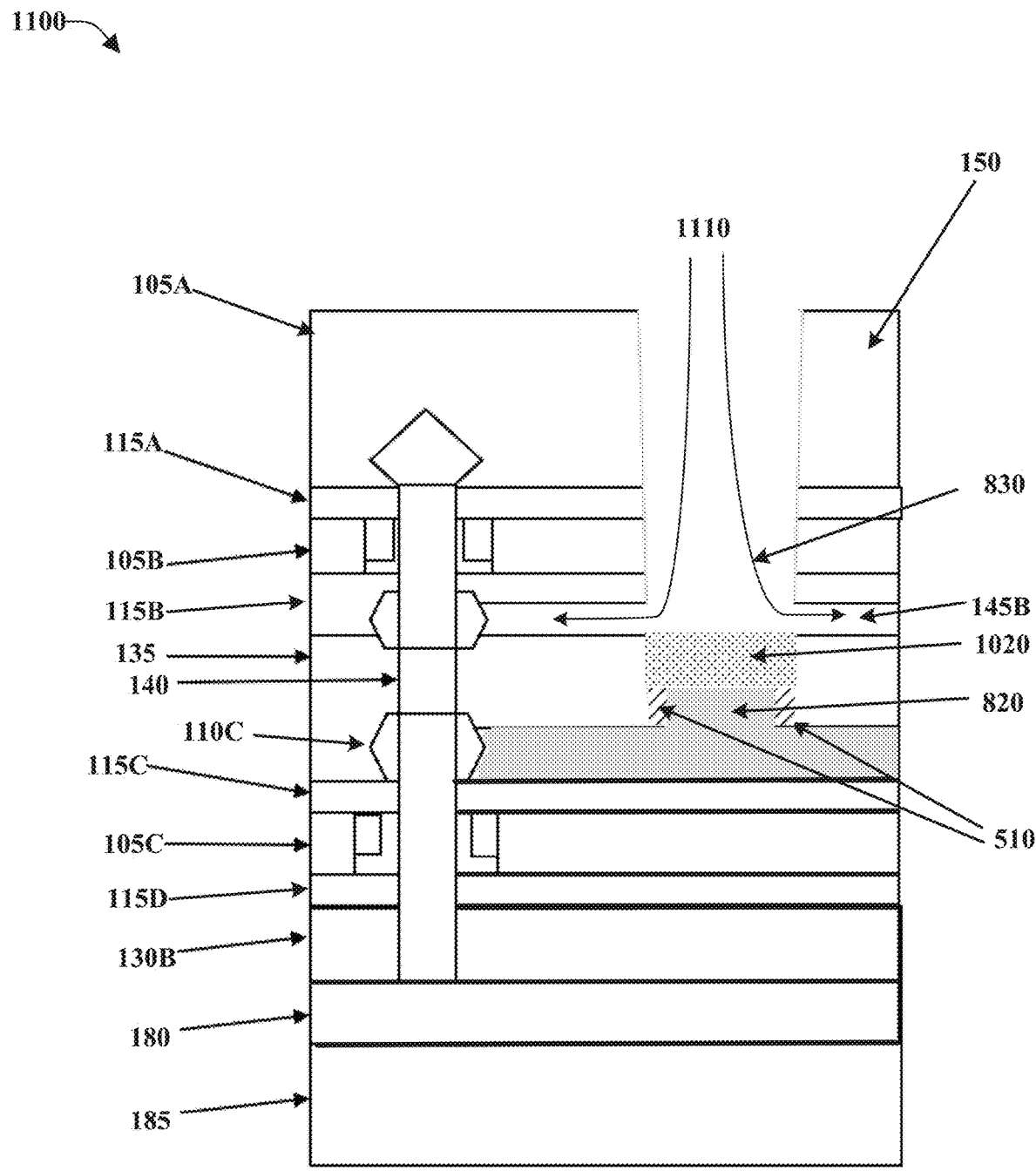
FIG. 11 illustrates an example, non-limiting, fin width cross-sectional view of the semiconductor structure of FIG. 10, during a fabrication stage where sacrificial material can be removed, in accordance with one or more embodiments described herein.

FIG. 11 illustrates an example, non-limiting fin width cross-sectional view 1100 of the semiconductor structure of FIG. 10, during a fabrication stage 1110 where sacrificial material in sacrificial layer 145B can be removed, in accordance with one or more embodiments described herein. As shown, during fabrication stage 1110, sacrificial layer 145B is removed to establish access to epitaxial layer 110B of first FET 190. The removal of the sacrificial layer 145B can define a space or path between via 830 and epitaxial layer 110B. Repetitive description of like elements employed in other embodiments described herein is omitted for sake of brevity.

In one or more embodiments, sacrificial layer 145B provides a temporary space defining a connective path that extends to the epitaxial layer 110B in which conductive material, such as a metal, can be filled. Sacrificial layer 145B is eroded or otherwise removed to expose epitaxial layer 110B of first FET 190. In one or more embodiments, sacrificial layer 145B can be eroded using a wet-etch process or a dry-etch process that selectively etches the sacrificial layer 145B while leaving remaining structures largely intact.

Figure 12:
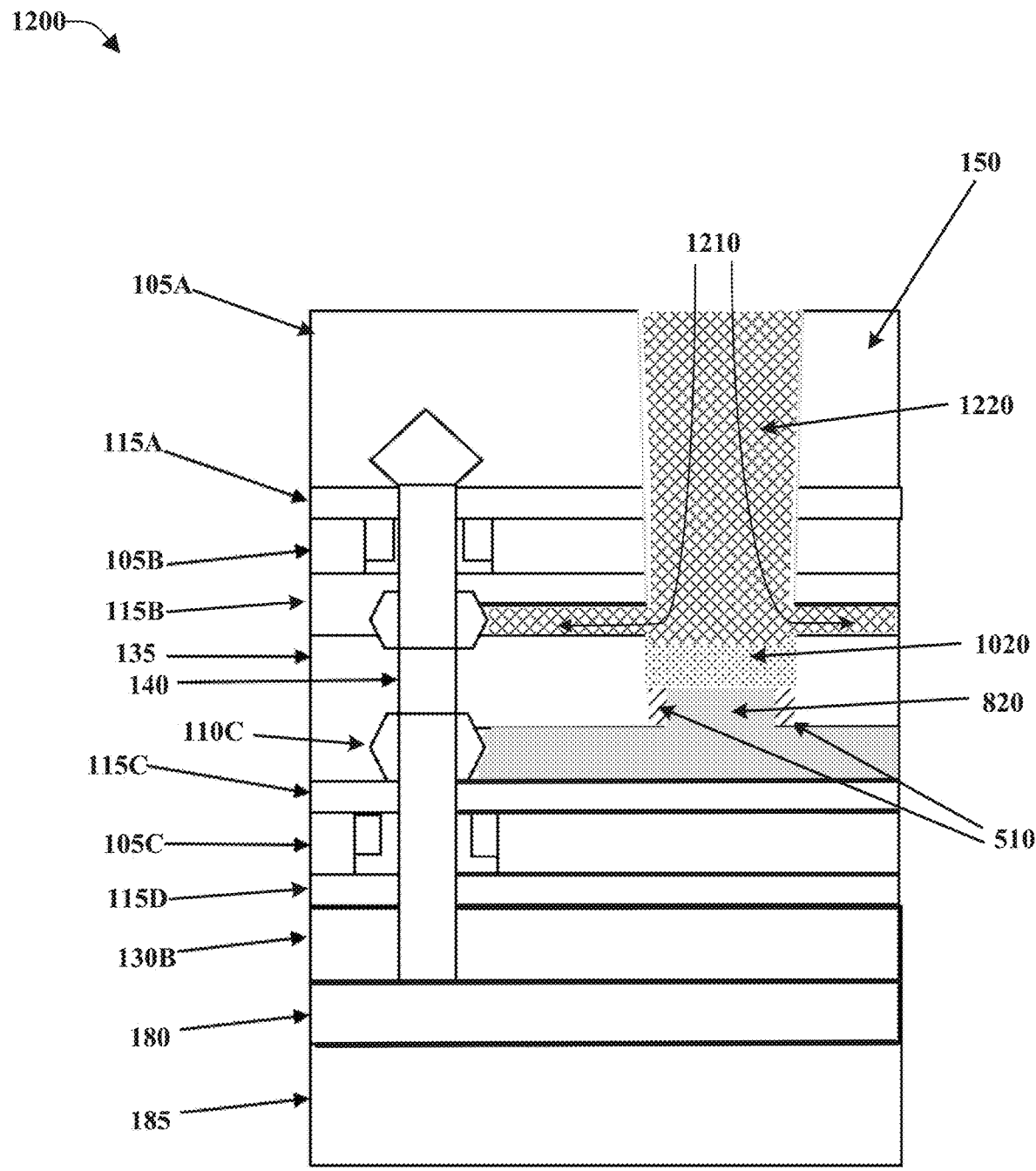
FIG. 12 illustrates an example, non-limiting, fin width cross-sectional view of the semiconductor structure of FIG. 11, during a fabrication stage where conductive material can be deposited into the via described in FIG. 11, in accordance with one or more embodiments described herein.

FIG. 12 illustrates an example, non-limiting, fin width cross-sectional view of the semiconductor structure of FIG. 11, during a fabrication stage 1210 where conductive material 1220 can be deposited substantially into via 830 and the free space of sacrificial layer 145B. Repetitive description of like elements employed in other embodiments described herein is omitted for sake of brevity.

Conductive material 1220 substantially fills the space of via 830 and the space left by the removal of the sacrificial material in sacrificial layer 145A to form a source/drain contact (e.g., with epitaxial layer 110C of first FET 190). Accordingly, conductive material 820 and conductive material 1220 can be source/drain contacts for first FET 190 and second FET 195, respectively, but that are also isolated from each other by cap 1010. Conductive material 1220 can be any metal or suitable material, including, but not limited to, indium-tin oxide, indium-zinc oxide, aluminum-zinc oxide, titanium, aluminum molybdenum, copper, cobalt, silver, gold, nickel, tungsten, chromium, hafnium, platinum, iron and their alloys.

Figure 13:
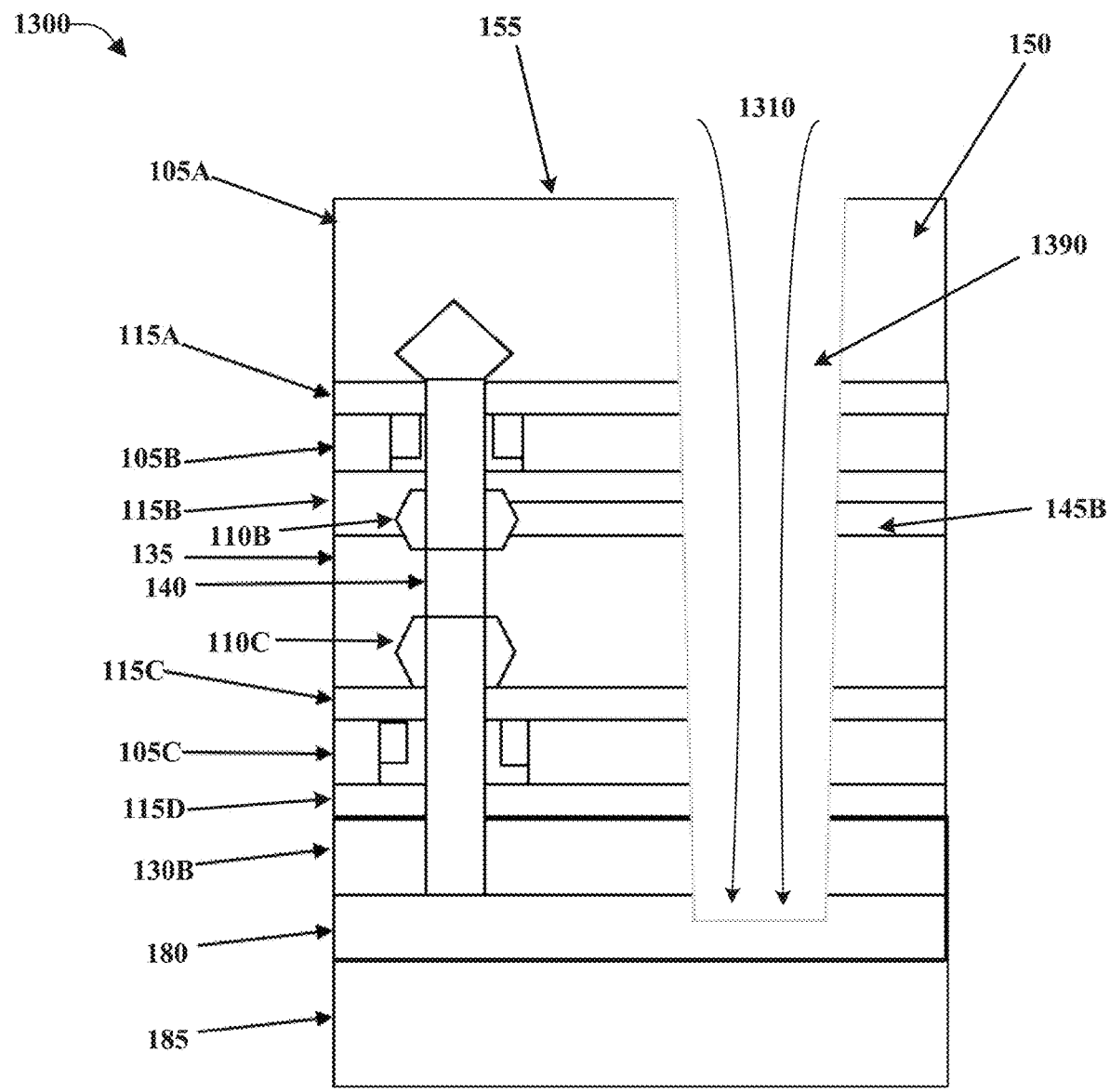
FIG. 13, for a second series of one or more embodiments, illustrates an example, non-limiting, fin width cross-sectional view of a semiconductor structure including a first FET and a second FET, in accordance with one or more embodiments described herein.

FIG. 13, for a second series of one or more embodiments, illustrates an example, non-limiting, fin width cross-sectional view of a semiconductor structure including a first FET and a second FET, in accordance with one or more embodiments described herein. As depicted, in the example of FIG. 13, a fabrication stage 1310 can be used to form via 1390.

Via 1390 can be an inter-layer recess that starts at the first surface 155 of semiconductor structure 150 and can traverse several layers down, passing through first ILD 105A layer, first spacer 115A, second ILD 105B layer, second spacer 115B, sacrificial layer 145B, isolation spacer 135, first spacer 115C, third ILD 105C layer, second spacer 115D, second epitaxial layer 110D, and layer 180, and ending at substrate layer 185. Different combinations of the same, additional, or fewer layers can also be traversed by via 1390 without departing from the spirit of embodiments described herein.

In one or more embodiments, via 1390 can be formed by patterning to remove a portion of semiconductor structure 150 to create a recess. Standard lithography and etching techniques can be used to pattern via 1390. In one or more embodiments, a directional etching process such as reactive ion etching (RIE) can be used for etching via 1390. In one or more embodiments, etching techniques, such as reactive ion etching noted above, can be used create via 390 with a different ending point. For example, instead of ending at substrate layer 185, via 390 can end at layer 180, or partway through substrate layer 185 to a determined depth (not shown). In one or more alternative embodiments, via 1390 can be formed by using different approaches, e.g., using techniques to form the via spaces within layers as they are created.

Figure 14:
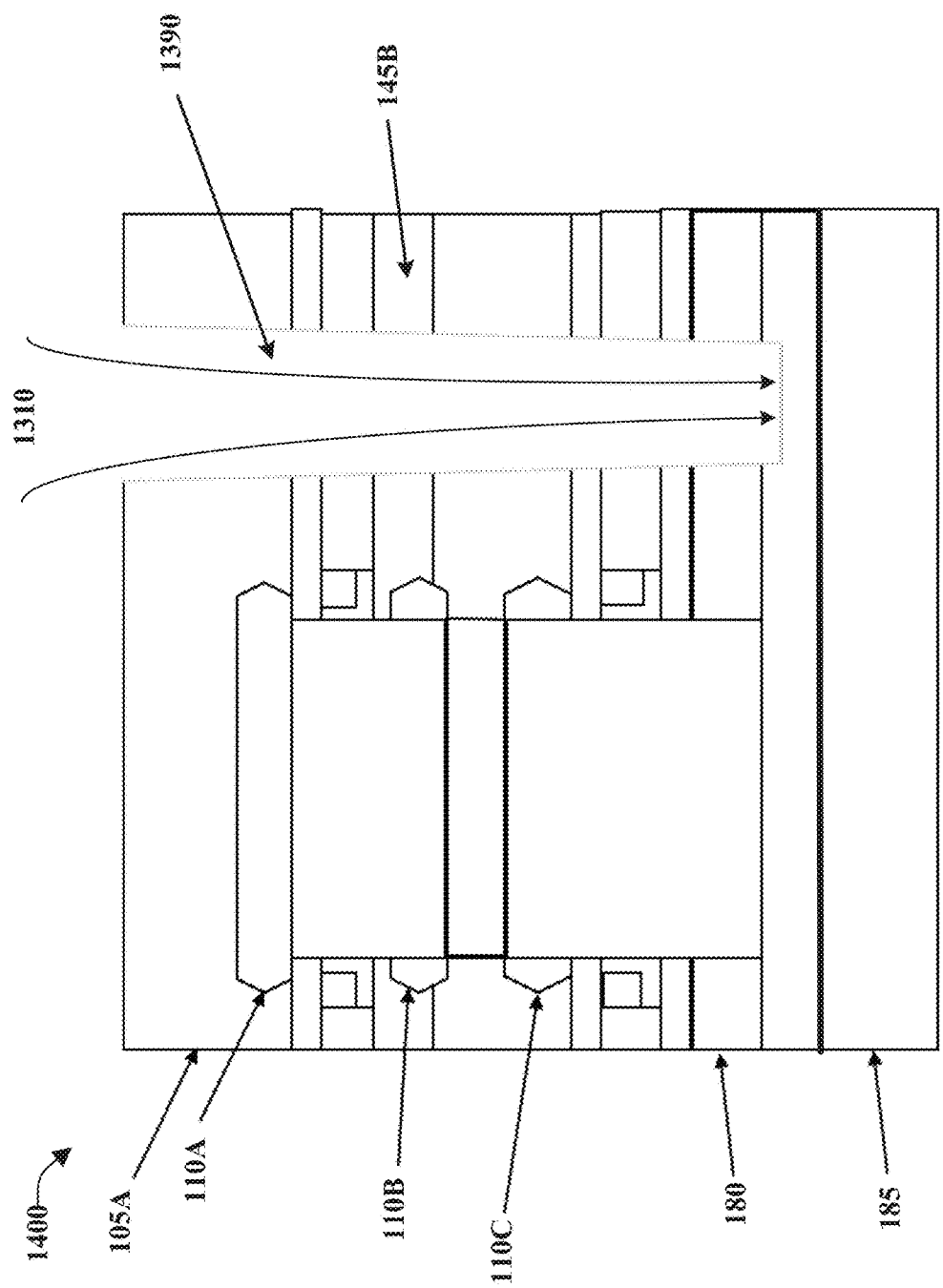
FIG. 14 illustrates an example, non-limiting fin length cross-sectional view of the example semiconductor structure described in FIG. 13, in accordance with one or more embodiments described herein.

FIG. 14 illustrates an example, non-limiting fin length cross-sectional view of the example semiconductor structure described in FIG. 13, in accordance with one or more embodiments described herein. Repetitive description of like elements employed in other embodiments described herein is omitted for sake of brevity.

The fin width and fin length views of via 1390 (e.g., FIGS. 13 and 14) are included to show example placements of a via in relation to the stacked VTFETs of semiconductor structure 150. For example, the different relative placements of via 1390 depicted in FIGS. 3 and 4, do not have any substantial effects on the operation of the embodiments described herein.

Figure 15:
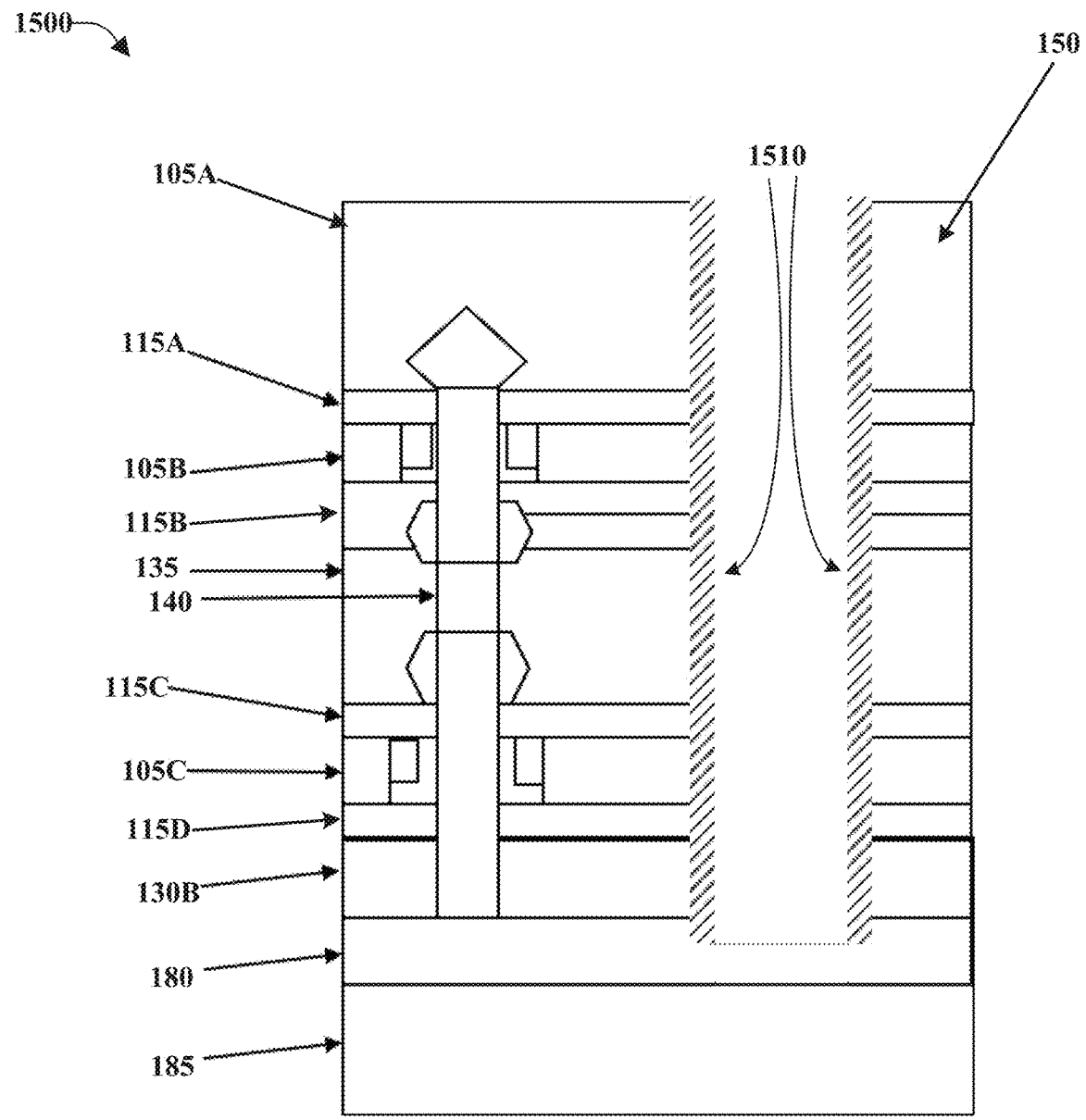
FIG. 15 illustrates an example, non-limiting, fin width cross-sectional view of the example semiconductor structure of FIG. 14 during a fabrication stage that can deposit a liner in a via, in accordance with one or more embodiments described herein. Repetitive description of like elements employed in other embodiments described herein is omitted for sake of brevity.

FIG. 15 illustrates an example, non-limiting, fin width cross-sectional view of the example semiconductor structure of FIG. 13 during a fabrication stage that can deposit a liner in a via, in accordance with one or more embodiments described herein. Repetitive description of like elements employed in other embodiments described herein is omitted for sake of brevity. As shown, a fabrication stage can be used to deposit liner material 1510 into via 1390, in accordance with one or more embodiments described herein. Repetitive description of like elements employed in other embodiments described herein is omitted for sake of brevity.

Liner 1510 can comprise any suitable materials, such as titanium nitride, or other known liner material(s). As shown, liner 1510 can line the sidewall (and bottom) surfaces of via 1390. Deposition of liner 1510 can be performed using, for example ALD, CVD, or PVD. Liner 1510 can be any suitable dimension. For example, liner 1510 can be, but is not limited to, about 5 angstroms to about 20 nm in thickness.

Figure 16:
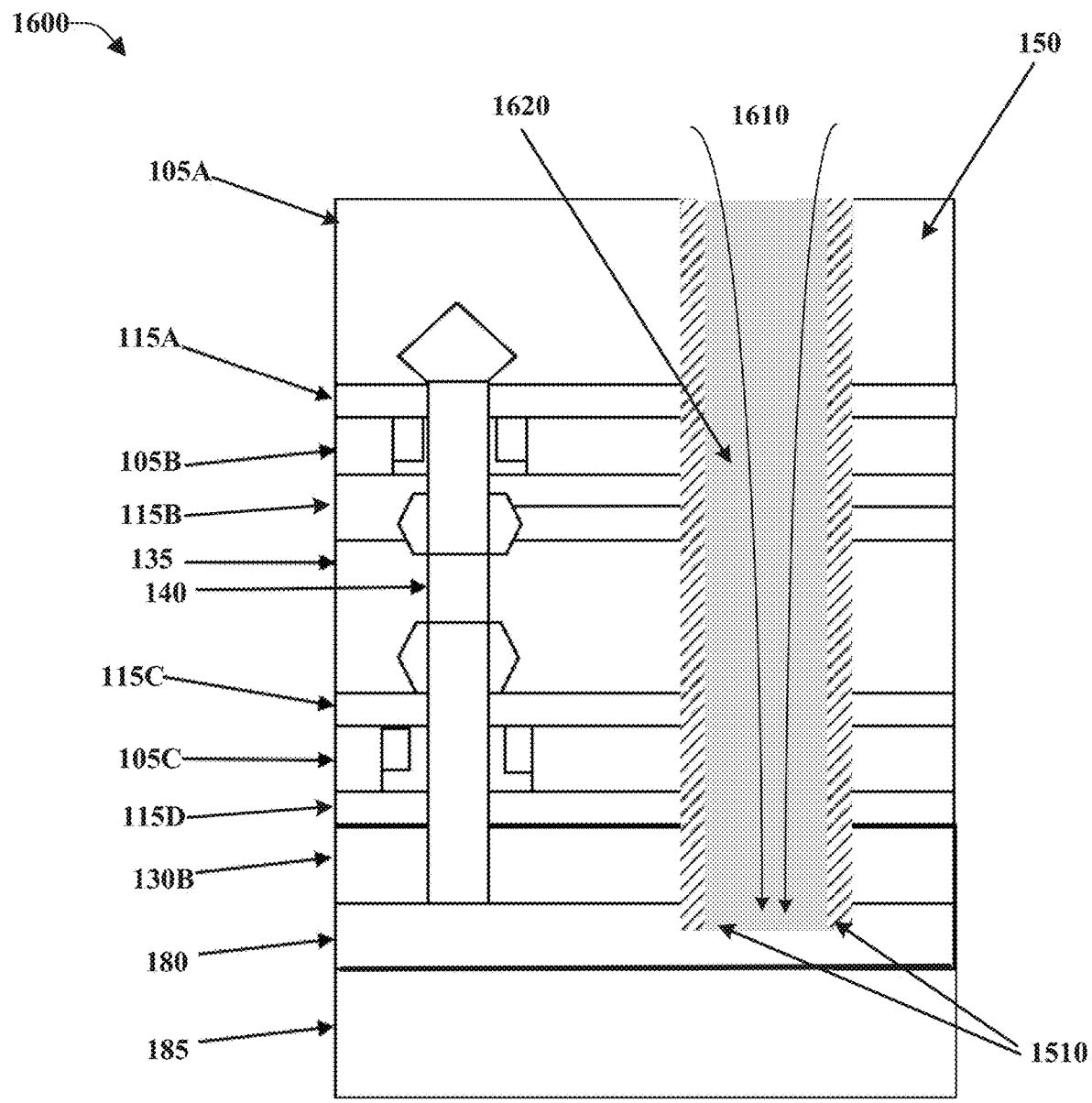
FIG. 16 illustrates an example, non-limiting, fin width cross-sectional view of the semiconductor structure of FIG. 15 during a fabrication stage where the conductive material can be deposited, in accordance with one or more embodiments described herein.

FIG. 16 illustrates an example, non-limiting, fin width cross-sectional view of the semiconductor structure of FIG. 13 during a fabrication stage where the conductive material can be deposited, in accordance with one or more embodiments described herein. As shown, a fabrication stage 1610 can be provided where conductive material 1620 is deposited into via 1390. Repetitive description of like elements employed in other embodiments described herein is omitted for sake of brevity.

Conductive material 1620 can be any metal or suitable material, including, but not limited to, indium-tin oxide, indium-zinc oxide, aluminum-zinc oxide, titanium, aluminum molybdenum, copper, cobalt, silver, gold, nickel, tungsten, chromium, hafnium, platinum, iron and their alloys.

Figure 17:
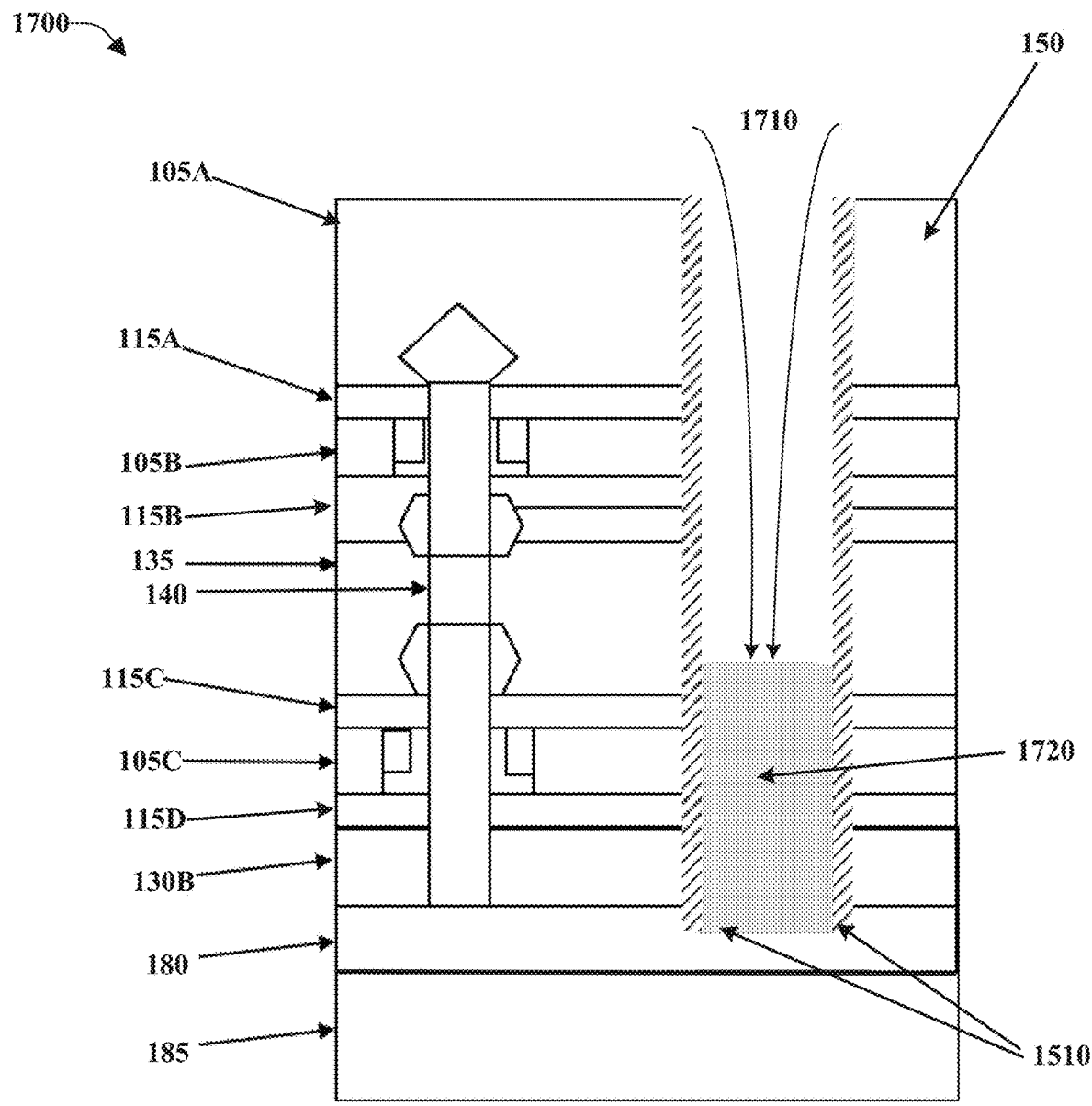
FIG. 17 illustrates an example, non-limiting, fin width cross-sectional view of the semiconductor structure of FIG. 16 during a fabrication stage where the conductive material can be recessed down, in accordance with one or more embodiments described herein.

FIG. 17 illustrates an example, non-limiting, fin width cross-sectional view of the semiconductor structure of FIG. 16 during a fabrication stage where the conductive material can be recessed down, in accordance with one or more embodiments described herein. Repetitive description of like elements employed in other embodiments described herein is omitted for sake of brevity.

As shown, a fabrication stage 1710 is provided where conductive material 1620 can be recessed down until a determined depth has been reached. In accordance with one or more embodiments described herein, conductive material 1620 can be recessed down to height below the top of second FET 195, or below the bottom of first FET 190. This position for remaining conductive material 1720 can facilitate providing an electrical coupling to layer 180 and/or substrate layer 185, for example, to provide a local interconnect to a power rail that connects to a voltage source, or ground plane that serves as an electrical ground.

Figure 18:
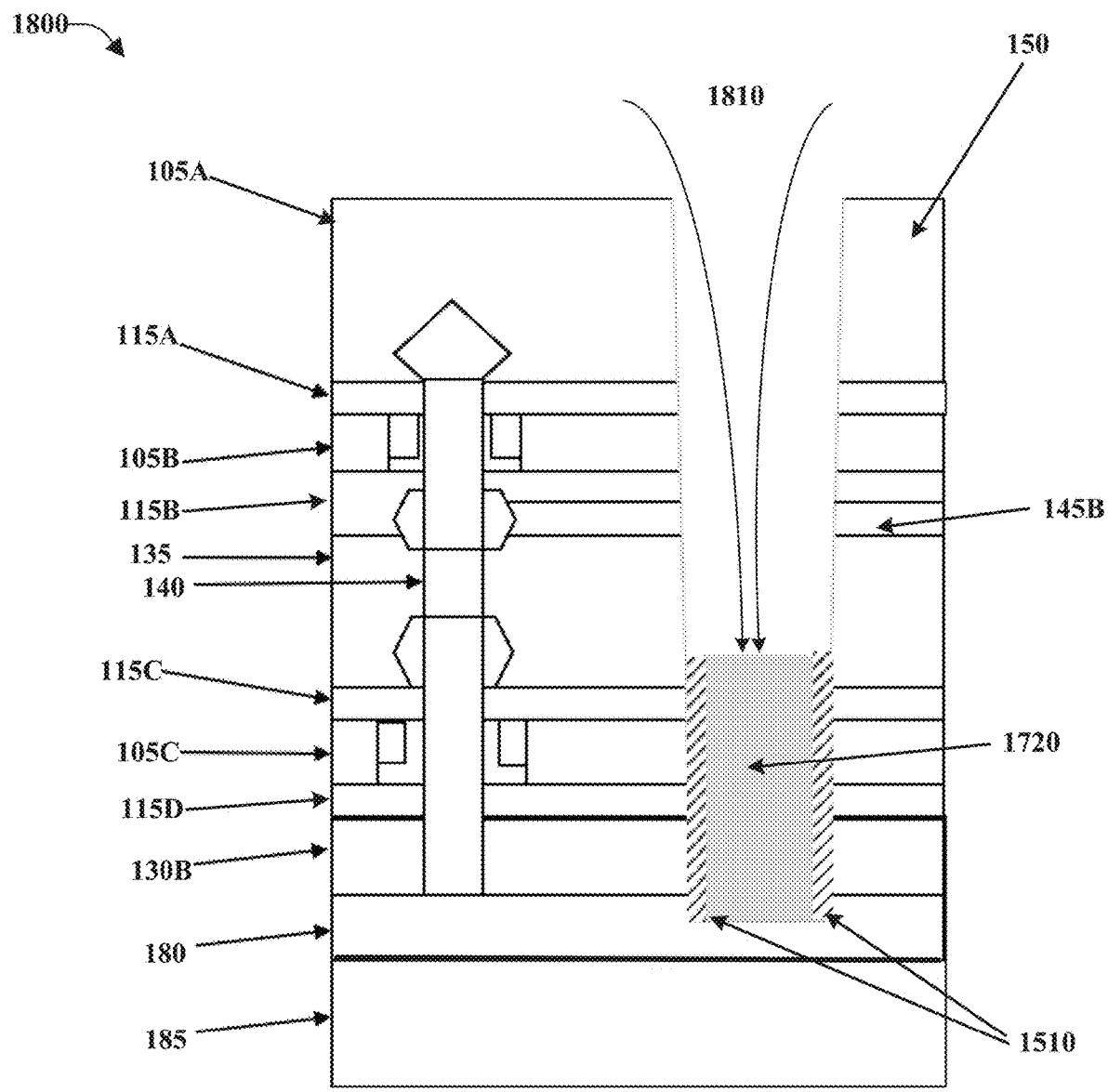
FIG. 18 illustrates an example, non-limiting, fin width cross-sectional view of the semiconductor structure of FIG. 17, during a fabrication stage where the liner in the via is removed, in accordance with one or more embodiments described herein.

FIG. 18 illustrates an example, non-limiting, fin width cross-sectional view of the semiconductor structure of FIG. 17, during a fabrication stage where portions of the liner 1510 in via 1390 is removed, in accordance with one or more embodiments described herein. In one or more embodiments, as shown, fabrication stage 1810 can use known lithography and etching techniques to selectively remove portions of liner 1510 above conductive material 1720.

Figure 19:
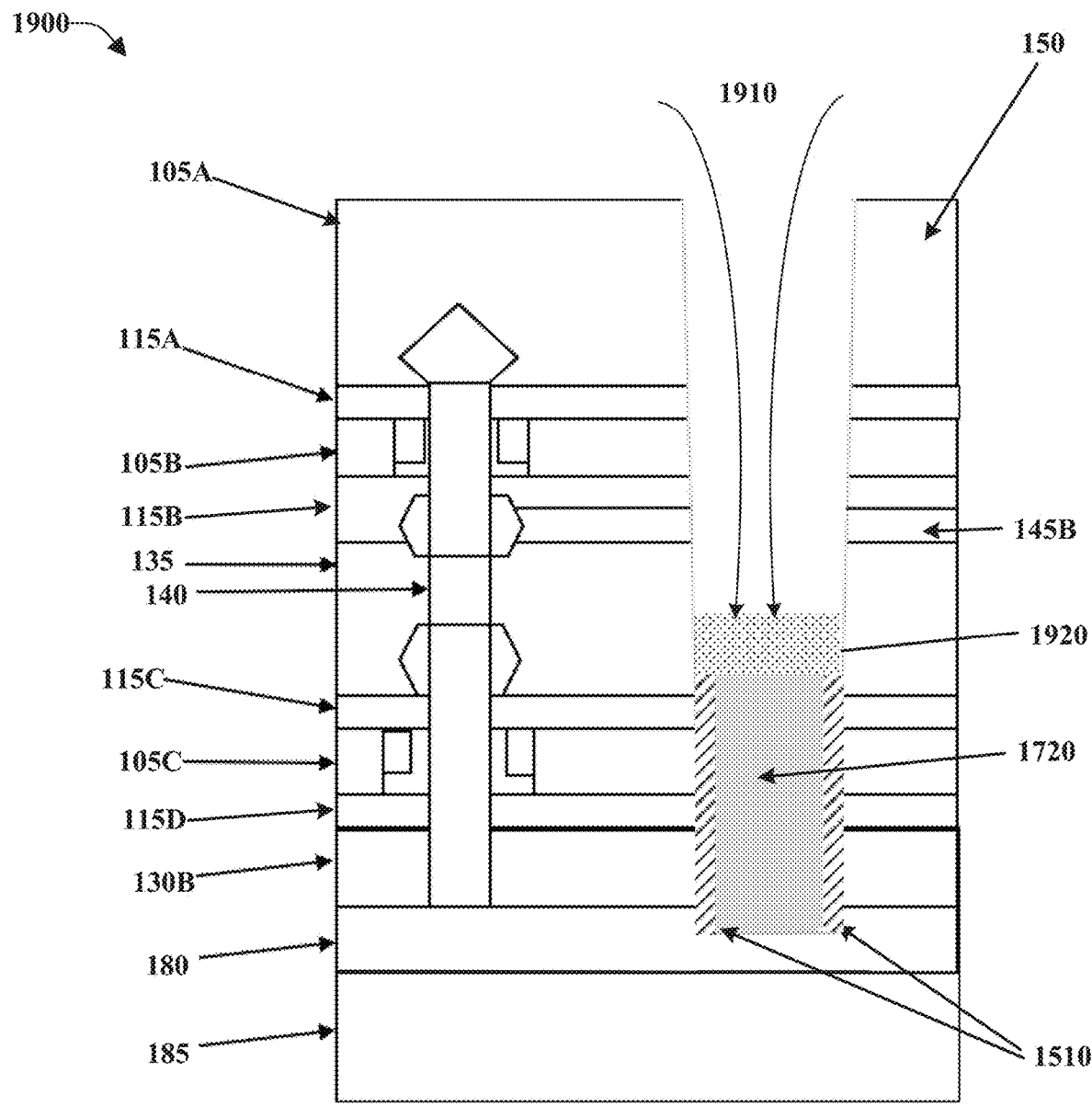
FIG. 19 illustrates an example, non-limiting fin length cross-sectional view of a semiconductor structure similar to the semiconductor structure of FIG. 18, during a fabrication stage where a non-conductive capping is deposited.

FIG. 19 illustrates an example, non-limiting fin length cross-sectional view of a semiconductor structure similar to the semiconductor structure of FIG. 18, during a fabrication stage 1910 where a non-conductive cap 1920 is deposited. Cap 1920 can be any non-conductive, capping material, such as a dielectric, and can be deposited on top of conductive material 1720 and serve as an insulator from conductive material 1720. Cap 1920 can be deposited until it reaches a determined height. In one or more embodiments, cap 1020 is deposited until it reaches a determined height, for example, below sacrificial layer 145B, or below first FET 190. Cap 1920 provides an isolation between conductive material 1720 and any interconnects above cap 1920. Thus, in the embodiments, vertically stacked transistors used in semiconductor structure 150 can be interconnected and/or wired efficiently both vertically and horizontally.

Figure 20:
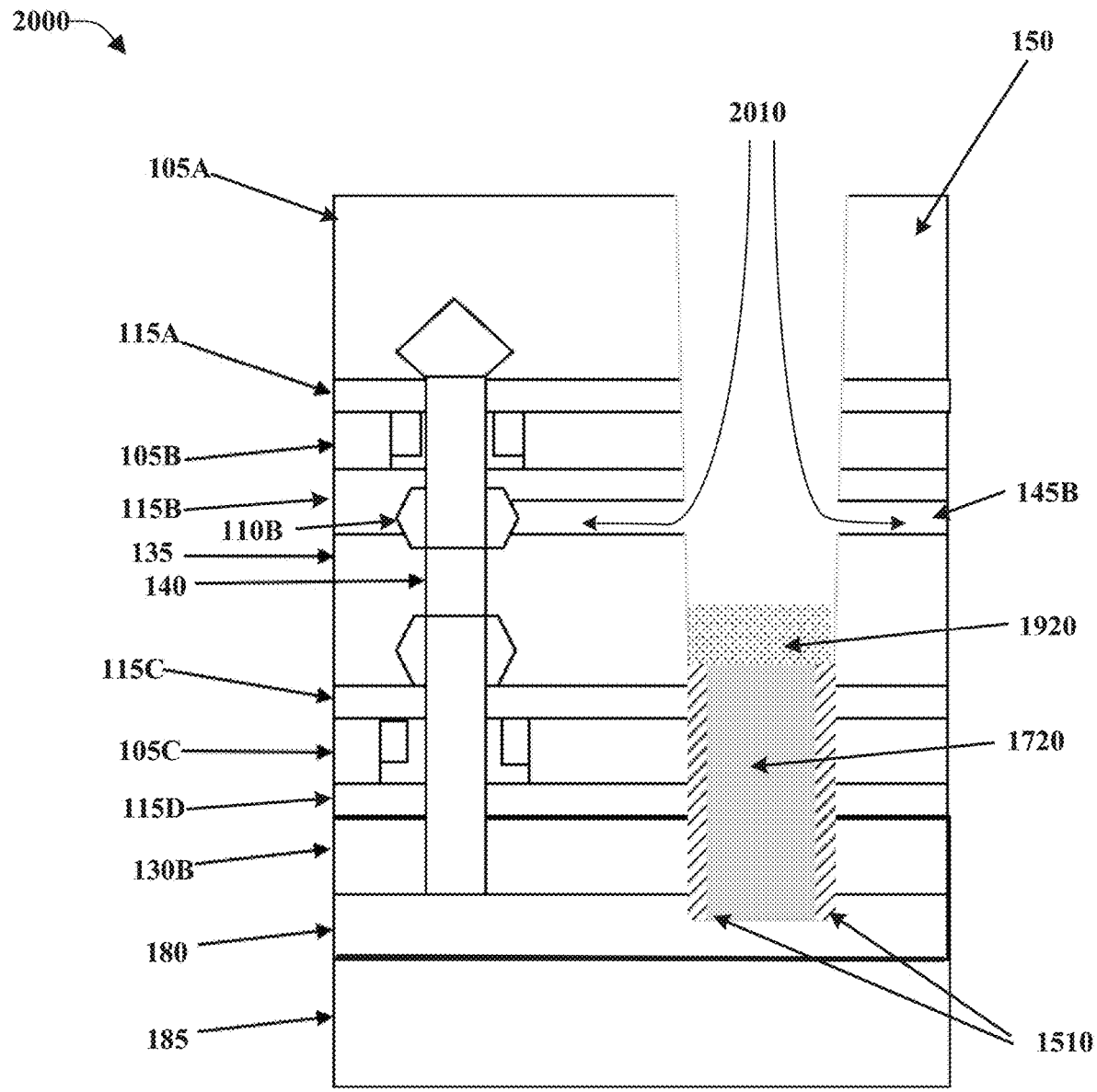
FIG. 20 illustrates an example, non-limiting, fin width cross-sectional view of the semiconductor structure of FIG. 19, during a fabrication stage where sacrificial material can be removed, in accordance with one or more embodiments described herein.

FIG. 20 illustrates an example, non-limiting, fin width cross-sectional view of the semiconductor structure of FIG. 19, during a fabrication stage where sacrificial material can be removed, in accordance with one or more embodiments described herein. As shown, a fabrication stage 2010 is provided to remove sacrificial layer 145B to define access or a path to epitaxial layer 110B of first FET 190. Repetitive description of like elements employed in other embodiments described herein is omitted for sake of brevity. In one or more embodiments, sacrificial layer 145B can be eroded using a wet-etch process or a dry-etch process that selectively etches the sacrificial layer 145B while leaving remaining structures largely intact. Accordingly, sacrificial layer 145B provides a temporary space defining a connective path that extends to the epitaxial layer 110B in which conductive material can be filled.

Figure 21:
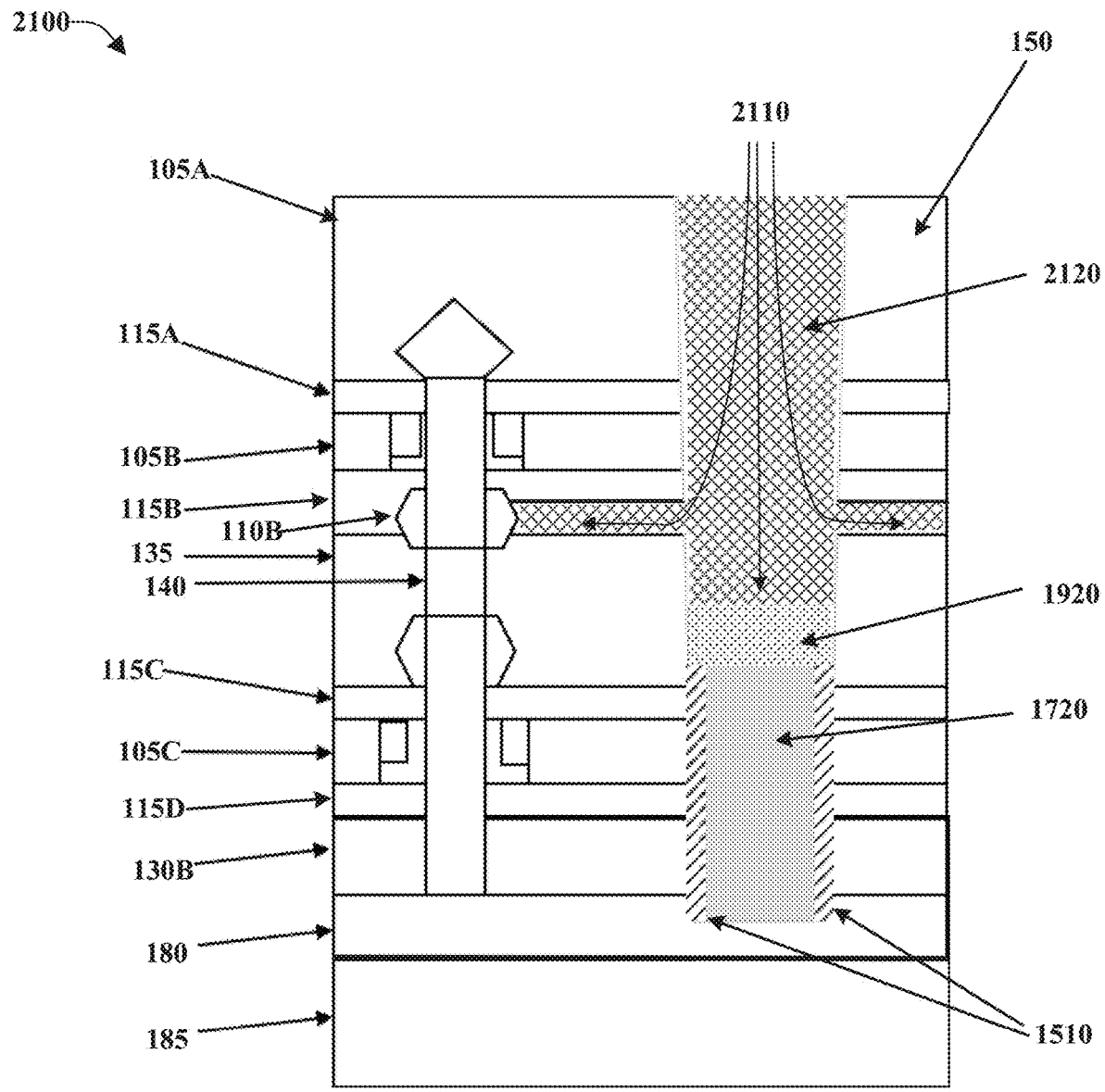
FIG. 21 illustrates an example, non-limiting, fin width cross-sectional view of the semiconductor structure of FIG. 20, during a fabrication stage where conductive material can be deposited substantially to the opening of the via, in accordance with one or more embodiments described herein.

FIG. 21 illustrates an example, non-limiting, fin width cross-sectional view of the semiconductor structure of FIG. 11, during a fabrication stage 2110. Repetitive description of like elements employed in other embodiments described herein is omitted for sake of brevity. As shown, conductive material 2120 can be deposited to substantially fill the free space above cap 1920 including the free space of sacrificial layer 145B and form a contact extending to epitaxial layer 110C (e.g., for first FET 190). Accordingly, conductive material 2120 can be a source/drain contact for first FET 190 that is electrically isolated from conductive material 1720 by cap 1010.

Conductive material 2120 can be any metal or suitable material, including, but not limited to, indium-tin oxide, indium-zinc oxide, aluminum-zinc oxide, titanium, aluminum molybdenum, copper, cobalt, silver, gold, nickel, tungsten, chromium, hafnium, platinum, iron and their alloys.

Figure 22:
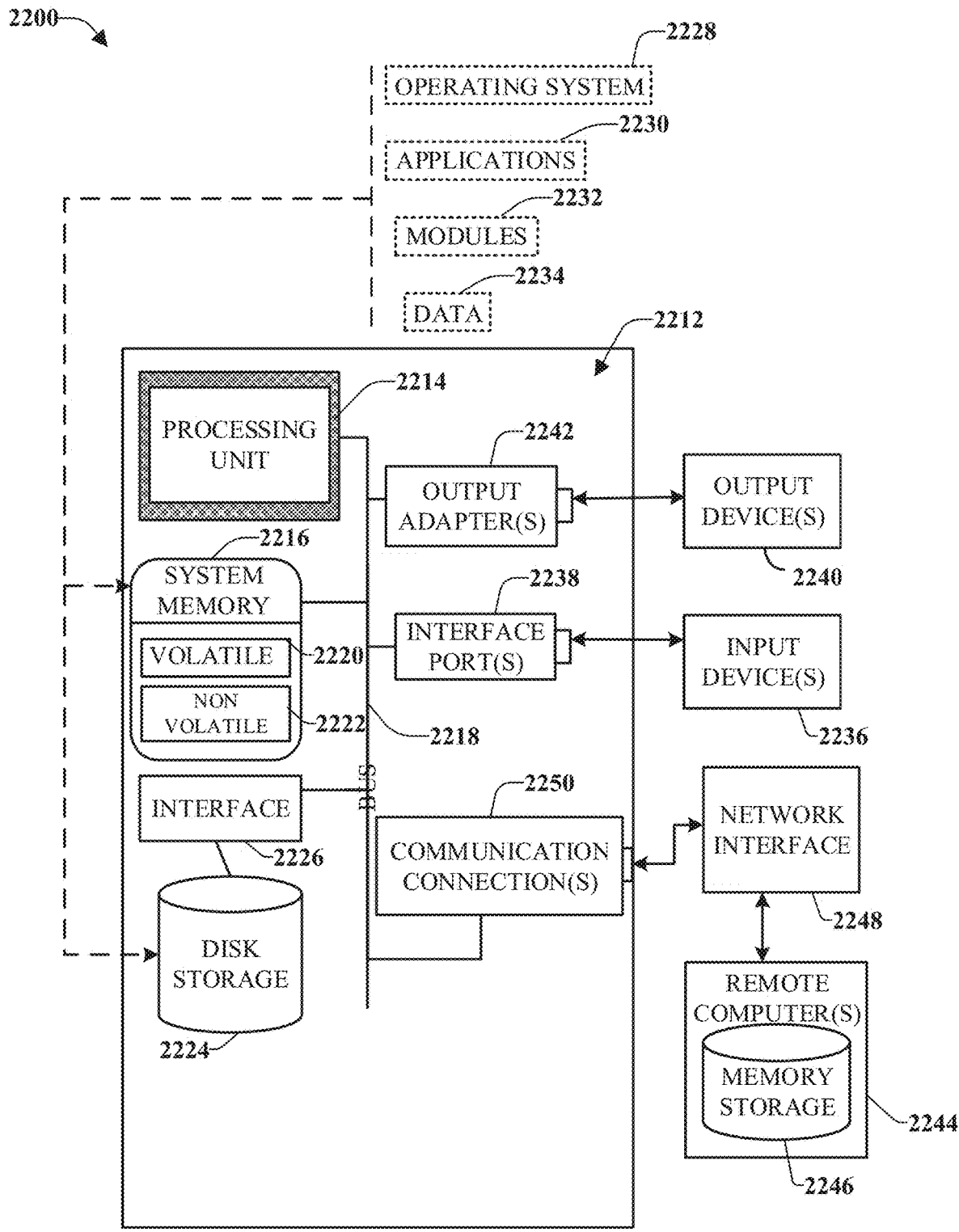
FIG. 22 illustrates a block diagram of an example, non-limiting operating environment in which one or more embodiments described herein can be facilitated.

FIG. 22 as well as the following discussion are intended to provide a general description of a suitable environment in which the various aspects of the disclosed subject matter can be implemented. FIG. 22 illustrates a block diagram of an example, non-limiting operating environment in which one or more embodiments described herein can be facilitated. Repetitive description of like elements employed in other embodiments described herein is omitted for sake of brevity. With reference to FIG. 22, a suitable operating environment 2200 for implementing various aspects of this disclosure can also include a computer 2212. The computer 2212 can also include a processing unit 2214, a system memory 2216, and a system bus 2218. The system bus 2218 couples system components including, but not limited to, the system memory 2216 to the processing unit 2214. The processing unit 2214 can be any of various available processors. Dual microprocessors and other multiprocessor architectures also can be employed as the processing unit 2214. The system bus 2218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 2216 can also include volatile memory 2220 and nonvolatile memory 2222. The basic input/output system (BIOS), containing the basic routines to transfer information between elements within the computer 2212, such as during start-up, is stored in nonvolatile memory 2222. By way of illustration, and not limitation, nonvolatile memory 2222 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 2220 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 2212 can also include removable/non-removable, volatile/nonvolatile computer storage media. FIG. 20 illustrates, for example, a disk storage 2224. Disk storage 2224 can also include, but is not limited to, devices like a magnetic disk drive, floppy disk drive, tape drive, Jaz drive, Zip drive, LS-100 drive, flash memory card, or memory stick. The disk storage 2224 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2224 to the system bus 2218, a removable or non-removable interface is typically used, such as interface 2226. FIG. 20 also depicts software that acts as an intermediary between users and the basic computer resources described in the suitable operating environment 2200. Such software can also include, for example, an operating system 2228. Operating system 2228, which can be stored on disk storage 2224, acts to control and allocate resources of the computer 2212. System applications 2230 take advantage of the management of resources by operating system 2228 through program modules 2232 and program data 2234, e.g., stored either in system memory 2216 or on disk storage 2224. It is to be appreciated that this disclosure can be implemented with various operating systems or combinations of operating systems. A user enters commands or information into the computer 2212 through input device (s) 2236. Input devices 2236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2214 through the system bus 2218 via interface port(s) 2238. Interface port(s) 2238 include, for example, a serial port, a parallel port, a game port, and a universal serial bus (USB). Output device (s) 2240 use some of the same type of ports as input device(s) 2236. Thus, for example, a USB port can be used to provide input to computer 2212, and to output information from computer 2212 to an output device 2240. Output adapter 2242 is provided to illustrate that there are some output devices 2240 like monitors, speakers, and printers, among other output devices 2240, which require special adapters. The output adapters 2242 include, by way of illustration and not limitation, video and sound cards that provide a method of connection between the output device 2240 and the system bus 2218. It should be noted that other devices and/or systems of devices provide both input and output capabilities such as remote computer(s) 2244.

Computer 2212 can operate in a networked environment using logical connections to one or more remote computers, such as remote computer(s) 2244. The remote computer(s) 2244 can be a computer, a server, a router, a network PC, a workstation, a microprocessor based appliance, a peer device or other common network node and the like, and typically can also include many or all of the elements described relative to computer 2212. For purposes of brevity, only a memory storage device 2246 is illustrated with remote computer(s) 2244. Remote computer(s) 2244 is logically connected to computer 2212 through a network interface 2248 and then physically connected via communication connection 2250. Network interface 2248 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2250 refers to the hardware/software employed to connect the network interface 2248 to the system bus 2218. While communication connection 2250 is shown for illustrative clarity inside computer 2212, it can also be external to computer 2212. The hardware/software for connection to the network interface 2248 can also include, for exemplary purposes only, internal and external technologies such as, modems including regular telephone grade modems, cable modems and DSL modems, ISDN adapters, and Ethernet cards.

Figure 23:
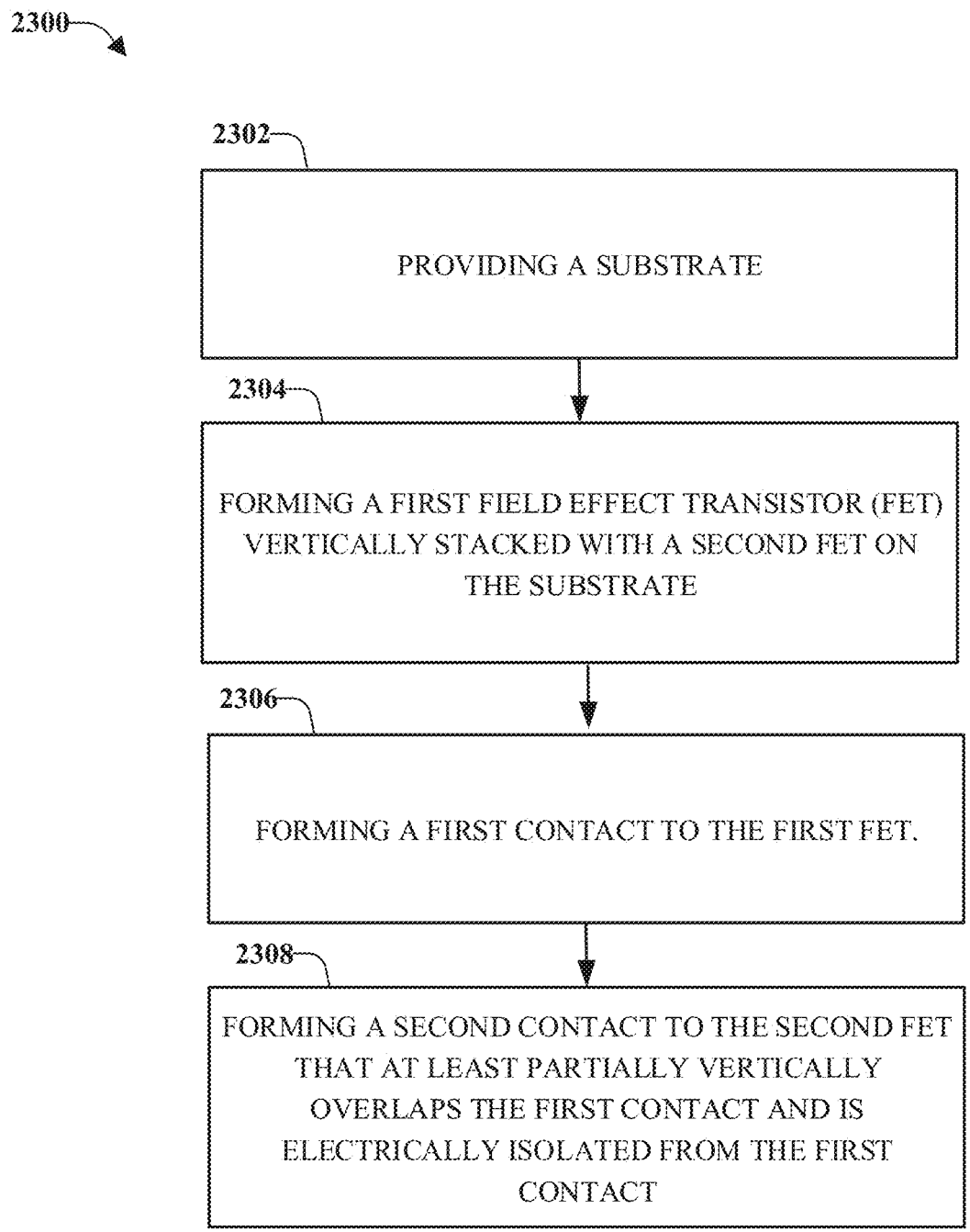
FIG. 23 illustrates a flow diagram of an example, non-limiting method for forming an isolated contact in a stacked vertical transport field effect transistor in accordance with one or more embodiments described herein.

FIG. 23, illustrates a flow diagram of an example, non-limiting method 2300 to fabricate a semiconductor device 150. Repetitive description of like elements employed in other embodiments described herein is omitted for sake of brevity.

At 2302, the method 2300 can include providing a substrate, for example, a silicon wafer.

At 2304, the method 2300 can include forming a first FET 190 vertically stacked with a second FET 195 on the substrate. The first FET 190 and second FET 195 can be fabricated using known techniques including, but not limited to, deposition, removal, patterning, and doping to form n-channel FETs or p-channel FETs. Deposition can include techniques such as physical vapor deposition (PVD), chemical vapor deposition (CVD), electrochemical deposition (ECD), molecular beam epitaxy (MBE) and, atomic layer deposition (ALD) among others. Removal can include wet or dry etch processes as well as chemical-mechanical planarization (CMP). Patterning can include, but is not limited to, lithography.

At 2306, the method 2300 can include forming a first contact to the first FET 190. As described above At 2308, the method 2300 can include forming a second contact to the second FET 195 that at least partially vertically overlaps the first contact and is electrically isolated from the first contact.

Once method 2300 has been completed, various semiconductor chips or die can be formed from the silicon wafer that provides the substrate (e.g., substrate layer 185). Each semiconductor chip or die can comprise any number of semiconductor devices 150.

For simplicity of explanation, the methodologies and/or computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a first vertical transport field effect transistor (VTFET) comprising a first contact;
    a second VTFET vertically stacked with the first VTFET and comprising a second contact that at least partially vertically overlaps the first contact and is electrically isolated from the first contact based on a non-conductive cap between the first contact and the second contact; and
    a via that extends to at least one of a drain or a source of the second VTFET and a source of the first VTFET, wherein the via is filled with a metal below the first VTFET to form the second contact, wherein the second contact is capped within the via below the first VTFET with a non-conductive material, and wherein the via is filled with a metal above the first VTFET to form the first contact.

2. The semiconductor structure of claim 1, wherein the first contact is a source contact of the first VTFET and the second contact is a drain contact of the second VTFET.

3. The semiconductor structure of claim 1, wherein the second contact is a source contact of the second VTFET and the first contact is a drain contact of the first VTFET.

4. The semiconductor structure of claim 1, wherein the second contact is electrically connected to an electrical ground.

5. The semiconductor structure of claim 1, wherein the second contact is electrically connected to a voltage source.

6. The semiconductor structure of claim 1, wherein the second contact is electrically connected to an interconnect to a third VTFET.

7. The semiconductor structure of claim 1, wherein the first VTFET is a p-channel field effect transistor and the second VTFET is an n-channel field effect transistor.

8. The semiconductor structure of claim 1, wherein the first VTFET is an n-channel field effect transistor and the second VTFET is a p-channel field effect transistor.

9. A method, comprising:
forming a first vertical transport field effect transistor (VTFET) vertically stacked with a second VTFET on a substrate;
forming a first contact to the first VTFET;
forming a second contact to the second VTFET that at least partially vertically overlaps the first contact and is electrically isolated from the first contact;
defining a via that extends to at least one of a drain or a source of the second VTFET and a source of the first VTFET;
filling the via with a metal below the first VTFET to form the second contact;
capping the second contact below the first VTFET with a non-conductive material; and
filling the via with a metal above the first VTFET to form the first contact.

10. The method of claim 9, further comprising:
defining the via that extends to the drain of the second VTFET.

11. The method of claim 9, further comprising:
defining the via that extends to the source of the second VTFET.

12. The method of claim 9, wherein the forming the second contact comprises electrically connecting the second contact to an electrical ground.

13. The method of claim 9, wherein the forming the second contact comprises electrically connecting the second contact to a voltage source.

14. The method of claim 9, wherein the forming the first VTFET stacked with the second VTFET comprises:
forming the first VTFET as an n-channel field effect transistor; and
forming the second VTFET as a p-channel field effect transistor.

15. The method of claim 9, wherein the forming the first VTFET stacked with the second VTFET comprises:
forming the first VTFET as a p-channel field effect transistor; and
forming the second VTFET as an n-channel field effect transistor.

16. A semiconductor chip, comprising:
a substrate;
a first vertical transport field effect transistor (VTFET) formed on the substrate and comprising a first contact;
a second VTFET transistor vertically stacked with the first VTFET and comprising a second contact that at least partially vertical overlaps the first contact and is electrically isolated from the first contact; and
a via that extends to at least one of a drain or a source of the second VTFET and a source of the first VTFET, wherein the via is filled with a metal below the first VTFET to form the second contact, wherein the second contact is capped within the via below the first VTFET with a non-conductive material, and wherein the via is filled with a metal above the first VTFET to form the first contact.

17. The semiconductor chip of claim 16, wherein the first contact is a source contact of the first VTFET, and the second contact is a drain contact of the second VTFET.

18. The semiconductor chip of claim 16, wherein the second contact is a source contact of the second VTFET and the first contact is a drain contact of the first VTFET.

19. The semiconductor chip of claim 16, wherein the second contact is electrically connected to an electrical ground.

20. The semiconductor chip of claim 16, wherein the second contact is electrically connected to a voltage source.

* * * * *